United States Patent
Tarutani

(10) Patent No.: US 7,635,553 B2
(45) Date of Patent: Dec. 22, 2009

(54) PATTERN FORMING METHOD AND RESIST COMPOSITION USED THEREFOR

(75) Inventor: Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/528,572

(22) Filed: Sep. 28, 2006

(65) Prior Publication Data

US 2007/0077519 A1 Apr. 5, 2007

(30) Foreign Application Priority Data

Sep. 30, 2005 (JP) .................... P.2005-289040

(51) Int. Cl.
*G03F 7/00* (2006.01)
*G03F 7/004* (2006.01)

(52) U.S. Cl. ............. 430/270.1; 430/281.1; 430/286.1; 430/311; 430/913; 430/935

(58) Field of Classification Search ............. 430/270.1, 430/281.1, 286.1, 311, 913, 935
See application file for complete search history.

(56) References Cited

U.S. PATENT DOCUMENTS

| | | | | |
|---|---|---|---|---|
| 5,962,187 | A * | 10/1999 | Takeda | 430/270.1 |
| 6,465,161 | B1 * | 10/2002 | Kang et al. | 430/327 |
| 6,506,535 | B1 * | 1/2003 | Mizutani et al. | 430/270.1 |
| 6,589,705 | B1 * | 7/2003 | Sato et al. | 430/270.1 |
| 6,596,458 | B1 * | 7/2003 | Sato et al. | 430/270.1 |
| 6,733,951 | B2 * | 5/2004 | Kodama | 430/270.1 |
| 6,794,108 | B1 * | 9/2004 | Sato et al. | 430/270.1 |
| 6,927,009 | B2 * | 8/2005 | Kodama et al. | 430/270.1 |
| 7,208,334 | B2 * | 4/2007 | Asakawa et al. | 438/29 |
| 7,250,246 | B2 * | 7/2007 | Mizutani | 430/270.1 |

FOREIGN PATENT DOCUMENTS

| | | |
|---|---|---|
| JP | 7-320999 A | 12/1995 |
| JP | 10-223501 A | 8/1998 |
| JP | 2000-82647 A | 3/2000 |
| JP | 2000-150352 A | 5/2000 |
| JP | 2000-321458 A | 11/2000 |
| JP | 2003-136014 A | 5/2003 |
| JP | 2003-303757 A | 10/2003 |
| JP | 2005-128516 A | 5/2005 |

\* cited by examiner

*Primary Examiner*—Amanda C. Walke
(74) *Attorney, Agent, or Firm*—Sughrue Mion, PLLC

(57) ABSTRACT

A pattern forming method comprising: coating a resist composition on a substrate; adjusting a rotational speed of the substrate within a range of 500 to 1,500 rpm so that a film thickness of the resist composition coated is adjusted; and subjecting the resist composition to drying, exposure and development, wherein the resist composition includes: (A) a compound capable of generating an acid upon irradiation with one of actinic rays and radiation; (B) a resin of which dissolution rate in an alkali developer increases under the action of an acid; (C) a mixed solvent; and (D) a surfactant, and the mixed solvent (C) includes at least one member selected from a group A of solvents and at least one member selected from a group B of solvents, or includes at least one member selected from the group A of solvents and at least one member selected from a group C of solvents: Group A: propylene glycol monoalkyl ether carboxylates, Group B: propylene glycol monoalkyl ethers, alkyl lactates, acetic acid esters, one of chain and cyclic ketones, and alkoxyalkyl propionates, and Group C: γ-butyrolactone, ethylene carbonate and propylene carbonate.

12 Claims, No Drawings

PATTERN FORMING METHOD AND RESIST COMPOSITION USED THEREFOR

BACKGROUND OF THE INVENTION

1. Field of the Invention

The present invention relates to a pattern forming method for use in the process of producing a semiconductor such as IC, in the production of a circuit board of liquid crystal, thermal head or the like or in other photofabrication processes, and also relates to a resist composition used therefor.

2. Background Art

The gate dimension of a semiconductor is becoming smaller year by year and according to the roadmap published in ITRS (The International Technology Roadmap for Semiconductor), the gate dimension and its dimensional variation in 3-sigma become 25 nm and 2.2 nm, respectively, in 2007. However, techniques known at present cannot achieve these dimensional controls.

In order to enhance the gate dimension uniformity, the dimensional uniformity of the resist pattern used at the gate processing must be enhanced, and enhancement of the dimensional uniformity have been heretofore made by various techniques.

The process of forming a resist pattern on a semiconductor substrate is generally a photolithography process comprising the following steps:

1. a photoresist solution is spin-coated on a semiconductor substrate (wafer),
2. the wafer is baked to remove the excess solvent contained in the coated photoresist layer,
3. the baked wafer is cooled to room temperature,
4. the photoresist layer is irradiated (exposed) with radiation though a mask to obtain a desired resist pattern,
5. the wafer is baked to make uniform the chemical reaction in the photoresist layer,
6. the baked wafer is cooled to room temperature,
7. the wafer is applied with a developer to remove the chemically changed photoresist layer (or chemically unchanged photoresist layer), and
8. the wafer is rinsed with pure water to remove the developer and then dried.

An attempt for enhancing the dimensional uniformity of the resist pattern is being made in each step such as coating, baking and development of the resist.

For example, it is studied to optimize the baking temperature, the temperature distribution of a hot plate on which the baking is performed, and the environment in which the hot plate is placed, or prevent re-adhesion of a volatile component from the resist onto the resist film at the baking.

As for the development step, it is studied to design the method of dropping a developer on the wafer, optimize the composition or temperature of the developer, or enhance the wettability of the resist film surface to the developer. Also, optimization of the concentration of the resist composition in the developer or optimization of the developing apparatus, particularly the shape of a nozzle for supplying a developer onto the wafer or the method of supplying the developer, is being studied.

As for the coating step, it is studied to enhance the dimensional uniformity by uniformly forming a resist film on a substrate. For example, in JP-A-7-320999 (the term "JP-A" as used herein means an "unexamined published Japanese patent application"), JP-A-10-223501, JP-A-2000-82647, JP-A-2000-150352, JP-A-2000-321458, JP-A-2003-136014, JP-A-2003-303757, JP-A-2005-128516, a method for forming a uniform coating film on a wafer is disclosed.

However, sufficiently high dimensional uniformity could not be achieved by these methods.

SUMMARY OF THE INVENTION

An object of the present invention is to provide a pattern forming method capable of forming a pattern having good dimensional uniformity, and a resist composition used therefor.

The present invention has the following constitutions and the above-described object of the present invention is attained by these constitutions.

(1) A pattern forming method comprising: coating a resist composition on a substrate; adjusting a rotational speed of the substrate within a range of 500 to 1,500 rpm so that a film thickness of the resist composition coated is adjusted; and subjecting the resist composition to drying, exposure and development, wherein the resist composition comprises: (A) a compound capable of generating an acid upon irradiation with one of actinic rays and radiation; (B) a resin of which dissolution rate in an alkali developer increases under the action of an acid; (C) a mixed solvent; and (D) a surfactant, and the mixed solvent (C) comprises at least one member selected from a group A of solvents and at least one member selected from a group B of solvents, or comprises at least one member selected from the group A of solvents and at least one member selected from a group C of solvents: Group A: propylene glycol monoalkyl ether carboxylates, Group B: propylene glycol monoalkyl ethers, alkyl lactates, acetic acid esters, one of chain and cyclic ketones, and alkoxyalkyl propionates, and Group C: γ-butyrolactone, ethylene carbonate and propylene carbonate.

(2) The pattern forming method as described in the item (1), wherein the surfactant (D) is one of a silicon- and fluorine-containing nonionic surfactant.

(3) The pattern forming method as described in the item (1) or (2), wherein the resin (B) comprises at least one repeating unit selected from repeating units having an alicyclic hydrocarbon-containing structure represented by one of formulae (pI) to (pV) and a repeating unit represented by formula (II-AB):

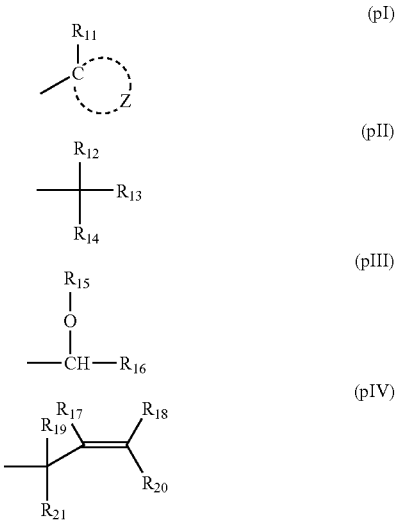

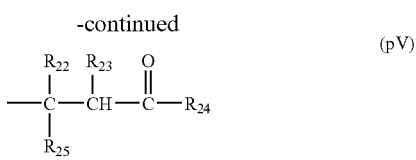

wherein $R_{11}$ represents one of a methyl group, an ethyl group, an n-propyl group, an isopropyl group, an n-butyl group, an isobutyl group and a sec-butyl group, Z represents an atomic group forming an alicyclic hydrocarbon group together with the carbon atom, $R_{12}$ to $R_{16}$ each independently represents one of a linear alkyl group having a carbon number of 1 to 4, a branched alkyl group having a carbon number of 1 to 4, and an alicyclic hydrocarbon group, at least one of $R_{12}$ to $R_{14}$ represents an alicyclic hydrocarbon group, and one of $R_{15}$ and $R_{16}$ represents an alicyclic hydrocarbon group, $R_{17}$ to $R_{21}$ each independently represents one of a hydrogen atom, one of a linear and a branched alkyl group having a carbon number of 1 to 4, and an alicyclic hydrocarbon group, at least one of $R_{17}$ to $R_{21}$ represents an alicyclic hydrocarbon group, and one of $R_{19}$ and $R_{21}$ represents one of a linear alkyl group having a carbon number of 1 to 4, a branched alkyl group having a carbon number of 1 to 4, and an alicyclic hydrocarbon group, $R_{22}$ to $R_{25}$ each independently represents one of a linear alkyl group having a carbon number of 1 to 4, a branched alkyl group having a carbon number of 1 to 4, and an alicyclic hydrocarbon group, and at least one of $R_{22}$ to $R_{25}$ represents an alicyclic hydrocarbon group, and $R_{23}$ and $R_{24}$ may combine with each other to form a ring;

wherein $R_{11}'$ and $R_{12}'$ each independently represents one of a hydrogen atom, a cyano group, a halogen atom, and an alkyl group which may have a substituent, and Z' represents an atomic group forming an alicyclic structure containing two bonded carbon atoms, which may have a substituent.

(4) A resist composition used for a pattern forming method described in any of the item (1) to (3).

By using the resist composition and the pattern forming method of the present invention, a uniform resist film can be formed and a resist pattern with excellent dimensional uniformity can be obtained.

DETAILED DESCRIPTION OF THE INVENTION

The present inventors have found that when the rotational speed at the coating of a resist composition containing a predetermined mixed solvent on a substrate by a spin coater or the like is set to 500 to 1,500 rpm, a uniform coated film can be obtained and a pattern with good dimensional uniformity can be obtained.

This resist composition comprises (A) a compound capable of generating an acid upon irradiation with actinic rays or radiation, (B) a resin of which dissolution rate in an alkali developer increases under the action of an acid, (C) a solvent and (D) a surfactant, wherein the component (C) is a mixed solvent comprising at least one member selected from the following group A of solvents and at least one member selected from the following group B of solvents or comprising at least one member selected from the group A of solvents and at least one member selected from the following group C of solvents:

Group A: propylene glycol monoalkyl ether carboxylates,
Group B: propylene glycol monoalkyl ethers, alkyl lactates, acetic acid esters, chain or cyclic ketones and alkoxyalkyl propionates, and
Group C: γ-butyrolactone, ethylene carbonate and propylene carbonate.

(Mixed Solvent)

The solvent contained in the resist composition of the present invention is a mixed solvent comprising at least one member of propylene glycol monoalkyl ether carboxylates (sometimes referred to a "group A solvent"), at least one member of propylene glycol monoalkyl ethers, alkyl lactates, acetic acid esters, chain or cyclic ketones and alkoxyalkyl propionates (sometimes referred to as a "group B solvent"), and/or γ-butyrolactone, ethylene carbonate or propylene carbonate (sometimes referred to as a "group C solvent").

That is, a single solvent selected from the group A, a combination of a group A solvent and a group B solvent, a combination of a group A solvent and a group C solvent, or a combination of a group A solvent, a group B solvent and a group C solvent is preferably used as the component (C).

(Group A)

The preferred propylene glycol monoalkyl ether carboxylate includes propylene glycol monomethyl ether acetate, propylene glycol monomethyl ether propionate, propylene glycol monoethyl ether acetate and propylene glycol monoethyl ether propionate.

(Group B)

The preferred propylene glycol monoalkyl ether includes propylene glycol monomethyl ether and propylene glycol monoethyl ether.

The preferred alkyl lactate includes methyl lactate and ethyl lactate.

The preferred acetic acid ester solvent includes butyl acetate, pentyl acetate and hexyl acetate, with butyl acetate being more preferred.

The chain ketone includes a heptanone, and the heptanone includes 2-heptanone, 3-heptanone and 4-heptanone, with 2-heptanone being preferred.

The cyclic ketone includes cyclopentanone, cyclohexanone and cycloheptanone, with cyclohexanone being preferred.

The preferred alkoxyalkyl propionate includes 3-ethoxyethyl propionate, 3-methoxymethyl propionate, 3-methoxyethyl propionate and 3-ethoxymethyl propionate.

(Group C)

This is a solvent selected from γ-butyrolactone, ethylene carbonate and propylene carbonate.

The weight ratio (A:B) of the group A solvent and the group B solvent used is preferably from 90:10 to 15:85, more preferably from 85:15 to 20:80, still more preferably from 80:20 to 25:75. The weight ratio (A:C) of the group A solvent and the group C solvent used is preferably from 99.9:0.1 to 75:25, more preferably from 99:1 to 80:20, still more preferably from 97:3 to 85:15.

(Surfactant)

Examples of the surfactant include a nonionic surfactant such as polyoxyethylene alkyl ethers, polyoxyethylene alkylallyl ethers, polyoxyethylene·polyoxypropylene block copolymers, sorbitan aliphatic esters and polyoxyethylene sorbitan aliphatic esters. One of these surfactants may be added alone, or several species thereof may be added in combination.

The resist composition of the present invention preferably contains any one species of fluorine- and/or silicon-containing surfactants (a fluorine-containing surfactant, a silicon-containing surfactant and a surfactant containing both fluorine atom and silicon atom), or two or more species thereof.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF351 and EF352 (produced by JEMCO Inc.); Florad FC4430 (produced by Sumitomo 3M Inc.); Megafac F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer with a (poly(oxyalkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F-178, F-470, F-473, F-475, F-476 and F-472 (produced by Dainippon Ink & Chemicals, Inc.) and further include a copolymer of an acrylate (or methacrylate) having a $C_6F_{13}$ group with a (poly(oxyalkylene)) acrylate (or methacrylate), a copolymer of an acrylate (or methacrylate) having a $C_6F_{13}$ group with (poly(oxyethylene)) acrylate (or methacrylate) and (poly(oxypropylene)) acrylate (or methacrylate), a copolymer of an acrylate (or methacrylate) having a $C_8F_{17}$ group with a (poly(oxyalkylene)) acrylate (or methacrylate), and a copolymer of an acrylate (or methacrylate) having a $C_8F_{17}C_8F_{17}$ group with (poly(oxyethylene)) acrylate (or methacrylate) and (poly(oxypropylene)) acrylate (or methacrylate).

The amount of the fluorine- and/or silicon-containing surfactant used is preferably from 0.01 to 2 mass %, more preferably from 0.02 to 1.5 mass %, based on the entire solid content of the resist composition.

The resin (A) of which dissolution rate in an alkali developer increases under the action of an acid and the compound (B) capable of generating an acid upon irradiation with actinic rays or radiation, which are further contained in the resist composition, are not particularly limited and their details are described later.

(Solid Content Concentration in Resist Composition)

The resist composition of the present invention has a solid content concentration adjusted so that the rotational speed for giving a desired film thickness when coating the composition on a semiconductor substrate can fall within the range of 500 to 1,500 rpm.

If the rotational speed for giving a desired film thickness is less than 500 rpm, the amount of the solvent contained in the resist film after spin coating becomes excessively large and this gives rise to the possibility that bumping of the solvent occurs in the baking step after spin coating to fail in obtaining a uniform coating film or a trouble is generated in the edge part of the resist film allowed to remain at the edge rinsing for removing an unnecessary resist in the outermost periphery of the wafer. On the other hand, if the rotational speed for giving a desired film thickness exceeds 1,500 rpm, the resist pattern obtained after development comes to have bad dimensional uniformity.

The resist composition of the present invention provides a high effect of enhancing the dimensional uniformity of the resist pattern when the desired film thickness is 200 nm or less, but if the film thickness is 50 nm or less, a sufficiently high masking effect is not obtained at the substrate etching and a defect may be generated in the pattern after etching.

When the resist composition has a low solid content concentration, the rotational speed for giving a desired film thickness can be low. Accordingly, the solid content concentration of the photoresist composition of the present invention is lower than the solid content concentration of a photoresist composition which is coated, for example, at a rotational speed of 2,000 rpm for giving a desired film thickness.

The suitable solid content concentration varies according to the desired film thickness and cannot be indiscriminately limited, but with a film thickness of 50 to 200 nm where the effect of the present invention is high, the solid content concentration is preferably from 1.0 to 10.0 mass %, more preferably from 2.0 to 9.0 mass %.

(Coating Method of Resist Composition)

In the pattern forming method of the present invention, the method for coating the resist composition on a wafer may be any method as long as the rotational speed for giving a desired film thickness is from 500 to 1,500 rpm. Generally, a method of first spreading the resist composition on the entire wafer surface, secondly spinning the wafer at a rotational speed for giving a desired film thickness, and thirdly spinning the wafer for removing the residual solvent, is employed. For example, in the methods described in JP-A-7-320999, JP-A-2000-150352, JP-A-2000-82647 and JP-A-2004-103781, the effect is obtained by coating the resist composition under the condition that the rotational speed for giving a desired film thickness is from 500 to 1,500 rpm.

The components contained in the resist composition each is described in detail below, but the present invention is not limited thereto.

(Component (A): Compound Capable of Generating an Acid Upon Irradiation with Actinic Rays or Radiation)

As for the compound capable of generating an acid upon irradiation with actinic rays or radiation (sometimes referred to as a "photoacid generator"), a photoinitiator for photocationic polymerization, a photoinitiator for photoradical polymerization, a photo-decoloring agent for coloring matters, a photo-discoloring agent, a compound capable of generating an acid upon irradiation with known light (e.g., ultraviolet light at 200 to 400 nm or far ultraviolet light, preferably g-line, h-line, i-line or KrF excimer laser light) used for a microresist or the like or with ArF excimer laser light, electron beam, X-ray, molecular beam or ion beam, or a mixture of such compounds may be appropriately selected and used.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate. Specific examples thereof include onium salts such as diazonium salt described in S. I. Schlesinger, Photogr. Sci. Eng., 18, 387 (1974), and T. S. Bal et al., Polymer, 21, 423 (1980), ammonium salt described in U.S. Pat. Nos. 4,069,055, 4,069,056 and Re27,992, and JP-A-3-140140, phosphonium salt described in D. C. Necker et al., Macromolecules, 17, 2468 (1984), C. S. Wen et al., Teh, Proc. Conf. Rad. Curing ASIA, p. 478, Tokyo, October (1988), and U.S. Pat. Nos. 4,069,055 and 4,069,056, iodonium salt described in J. V. Crivello et al., Macromolecules, 10 (6), 1307 (1977), Chem. & Eng. News, November 28, page 31 (1988), European Patent 104,143, U.S. Pat. Nos. 339,049 and 410,201, JP-A-2-150848 and JP-A-2-296514, sulfonium salt described in J. V. Crivello et al., Polymer J., 17, 73 (1985), J. V. Crivello et al., J. Org. Chem., 43, 3055 (1978), W. R. Watt et al., J. Polymer Sci. , Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci. , Polymer Chem. Ed., 17, 2877 (1979), European Patents 370,693, 161,811, 410,201, 339, 049, 233,567, 297,443 and 297,442, U.S. Pat. Nos. 3,902, 114, 4,933,377, 4,760,013, 4,734,444 and 2,833,827, German Patents 2,904,626, 3,604,580 and 3,604,581, JP-A-7-28237 and JP-A-8-27102, selenonium salt described in J. V. Crivello et al., Macromolecules, 10 (6), 1307 (1977), and J. V. Crivello et al., J. Polymer Sci. , Polymer Chem. Ed., 17, 1047 (1979), and arsonium salt described in C. S. Wen et al., Teh, Proc. Conf. Rad. Curing ASIA, page 478, Tokyo, October (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896) and JP-A-2-161445; photoacid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett. , (24) 2205 (1973), D. H. R. Barton et al., J. Chem. Soc., 3571 (1965), P. M. Collins et al., J. Chem. Soc. , Perkin I, 1695 (1975), M. Rudinstein et al., Tetrahedron Lett. , (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc. Chem. Commun., 532 (1972), S. Hayase et al., Macromolecules, 18, 1799 (1985), E. Reichman et al., J. Electrochem. Soc., Solid State Sci. Technol., 130 (6), F. M. Houlihan et al., Macromolecules, 21, 2001 (1988), European Patents 0,290,750, 046,083, 156, 535, 271,851 and 0,388,343, U.S. Pat. Nos. 3,901,710 and 4,181,531, JP-A-60-198538 and JP-A-53-133022; compounds capable of photochemically decomposing to generate a sulfonic acid, as represented by iminosulfonate, described in M. TUNOOKA et al., Polymer Preprints Japan, 35 (8), G. Bemer et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 044,115, 618,564 and 0,101,122, U.S. Pat. Nos. 4,371,605 and 4,431,774, JP-A-64-18143, JP-A-2-245756 and JP-A-3-140109; disulfone compounds described in JP-A-61-166544 and JP-A-2-71270; and diazoketosulfone and diazodisulfone compounds described in JP-A-3-103854, JP-A-3-103856 and JP-A-4-210960.

Furthermore, a compound obtained by incorporating such a group or compound capable of generating an acid by the effect of light into the main or side chain of a polymer can be used, and examples thereof include the compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci. , Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029. In addition, the compounds capable of generating an acid by the effect of light described, for example, in V. N. R. Pillai, Synthesis, (1), 1 (1980), A. Abad et al., Tetrahedron Lett. , (47) 4555 (1971), D. H. R. Barton et al., J. Chem. Soc., (C), 329 (1970), U.S. Pat. No. 3,779,778 and European Patent 126,712 may also be used.

The amount of the component (A) added is preferably from 0.1 to 20 mass %, more preferably from 0.5 to 10 mass %, still more preferably from 1 to 7 mass %, based on the entire solid content of the resist composition.

Preferred examples of the component (A) are set forth below, but the present invention is not limited thereto.

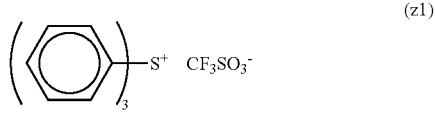
(z1)

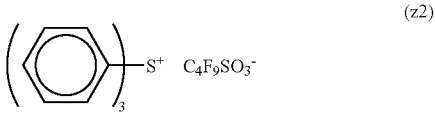
(z2)

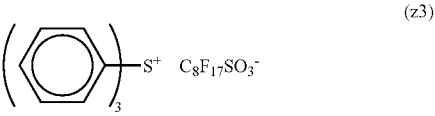
(z3)

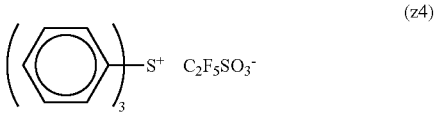
(z4)

-continued
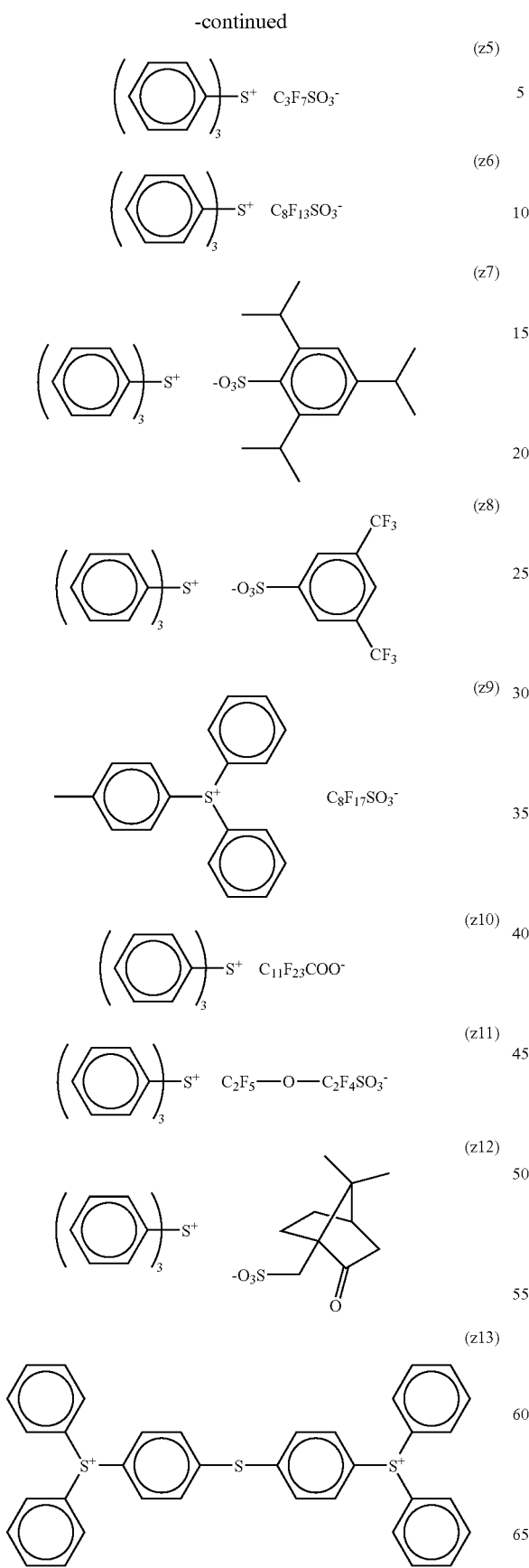
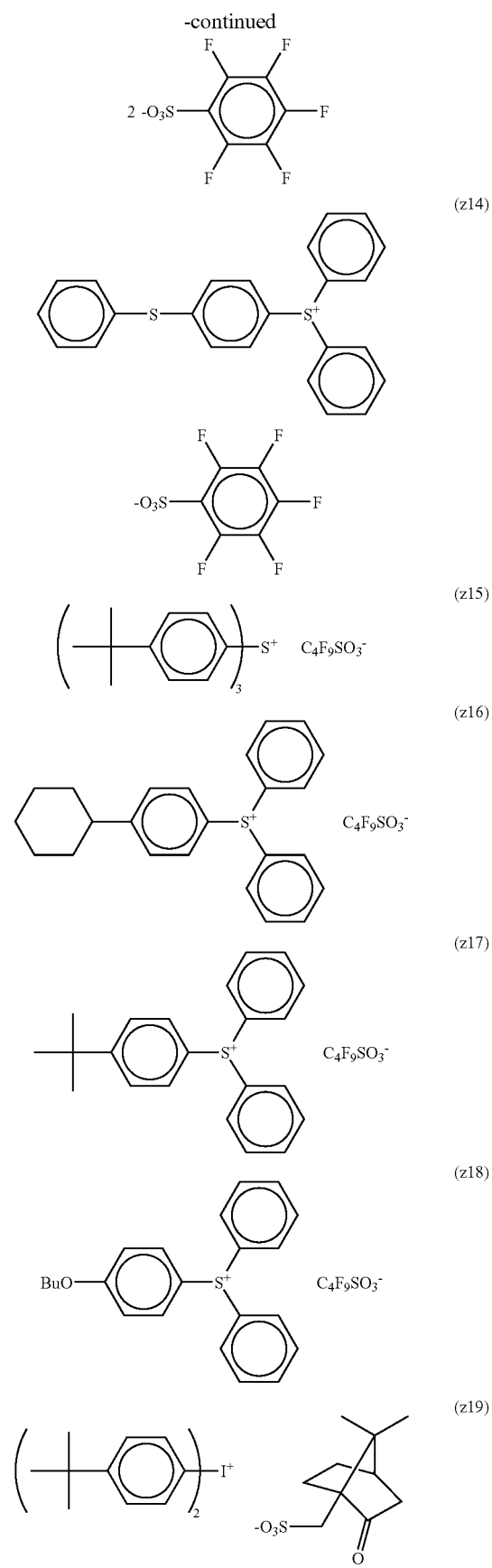

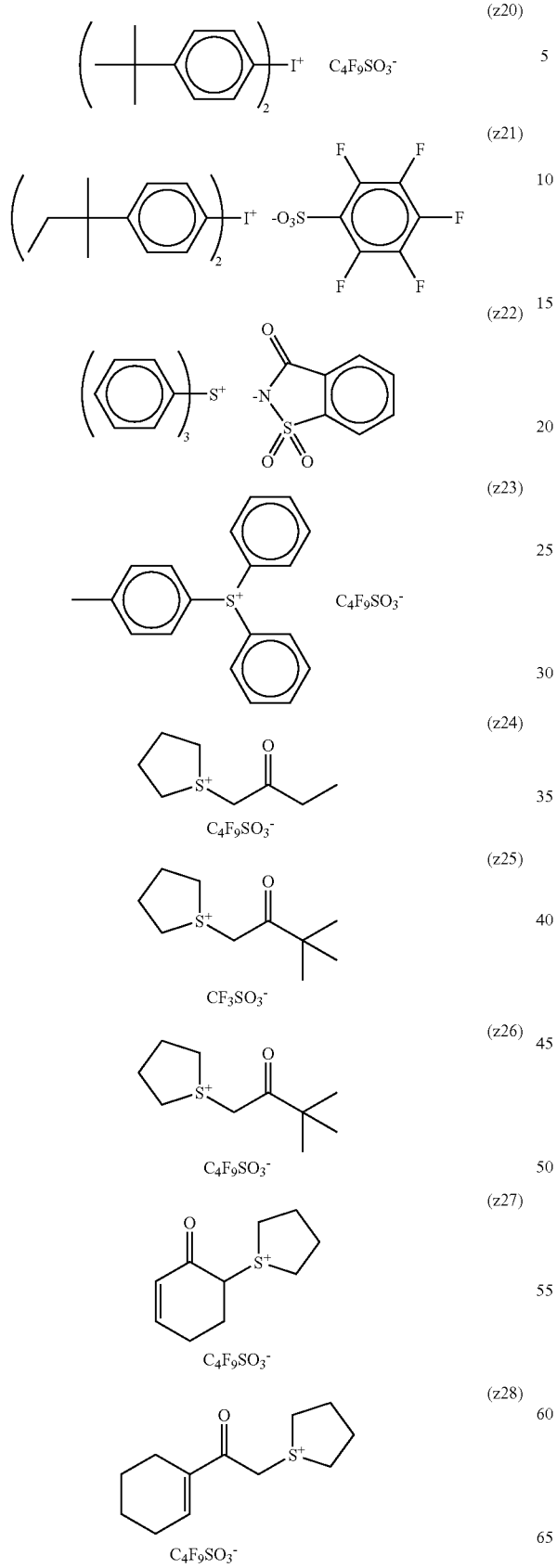
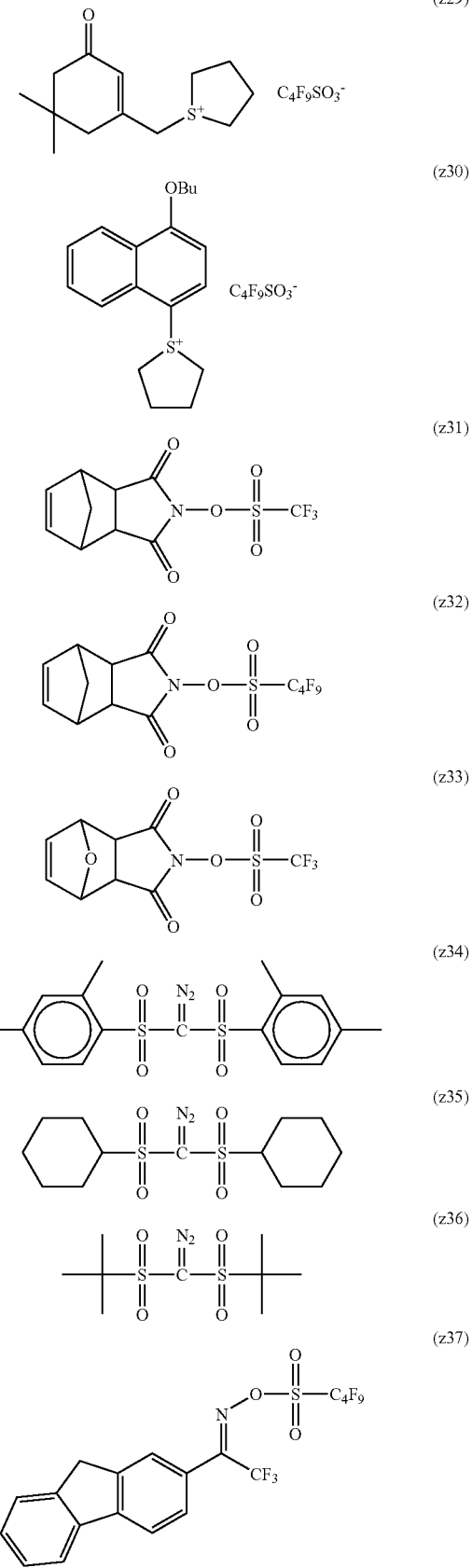

(z38)
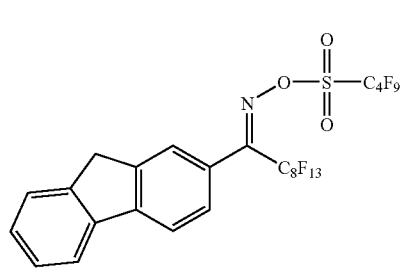
(z39)
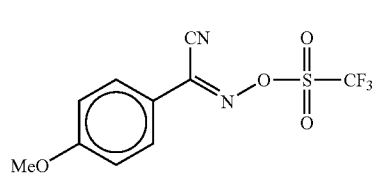
(z40)
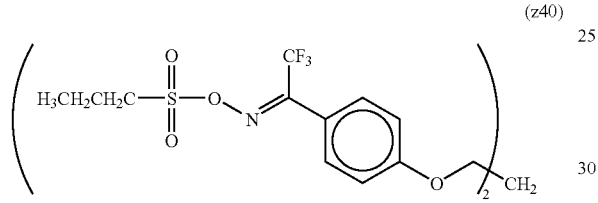
(z41)
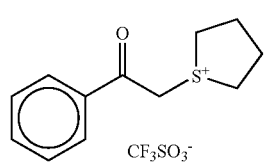
CF$_3$SO$_3^-$
(z42)
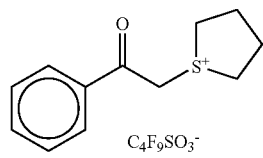
C$_4$F$_9$SO$_3^-$
(z43)
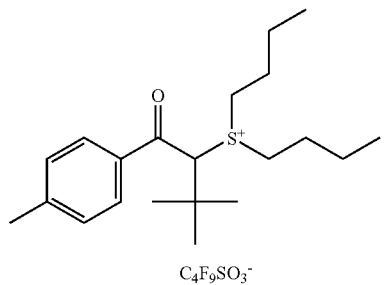
C$_4$F$_9$SO$_3^-$
(z44)
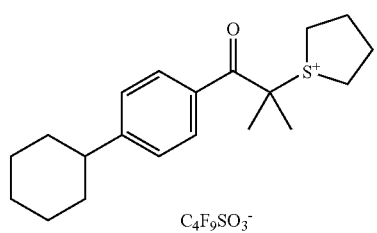
C$_4$F$_9$SO$_3^-$
(z45)
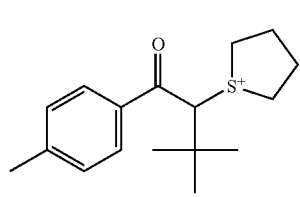
C$_4$F$_9$SO$_3^-$
(z46)
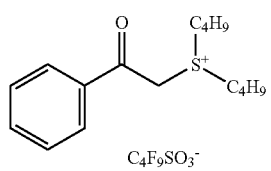
C$_4$F$_9$SO$_3^-$
(z47)
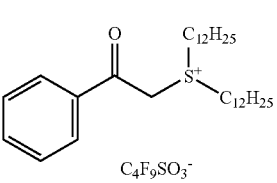
C$_4$F$_9$SO$_3^-$
(z48)
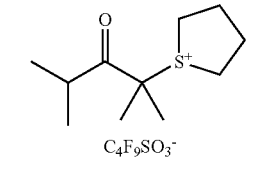
C$_4$F$_9$SO$_3^-$
(z49)
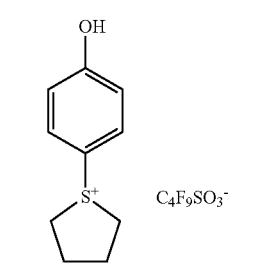
C$_4$F$_9$SO$_3^-$
(z50)
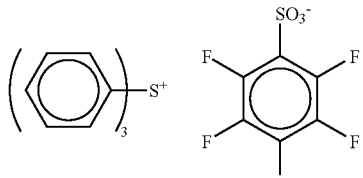
(z51)
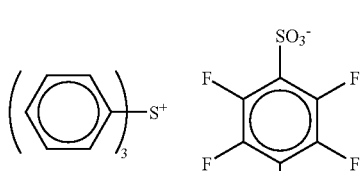

-continued
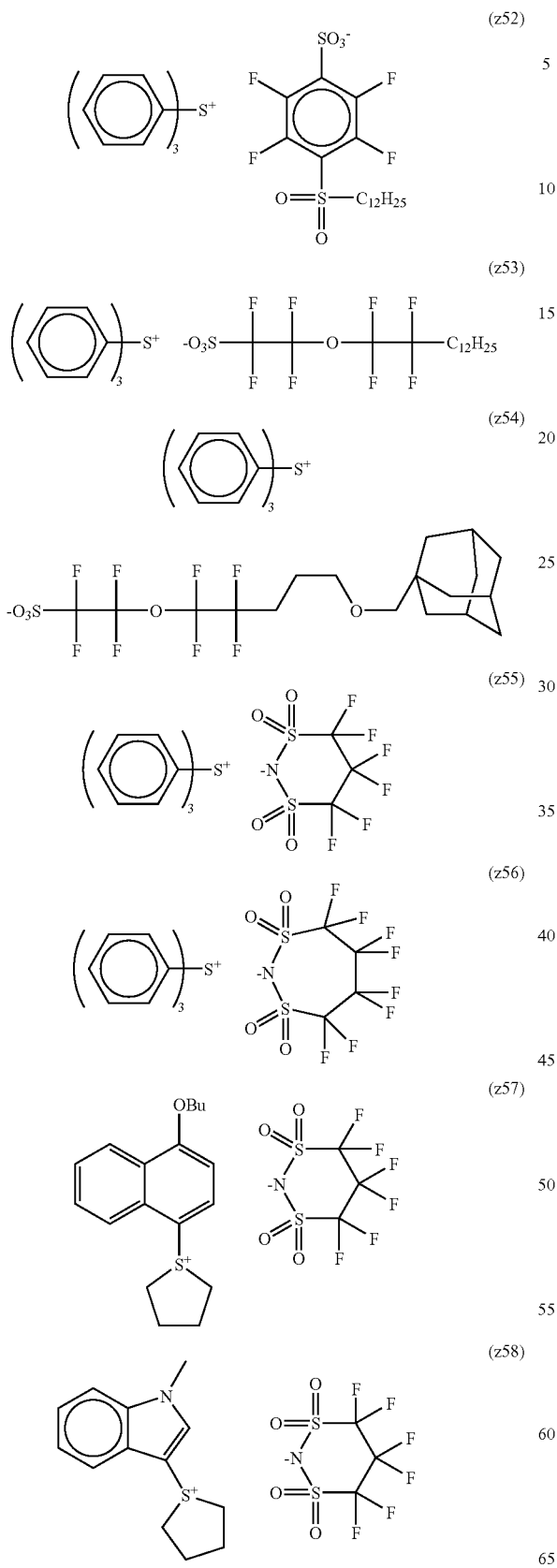
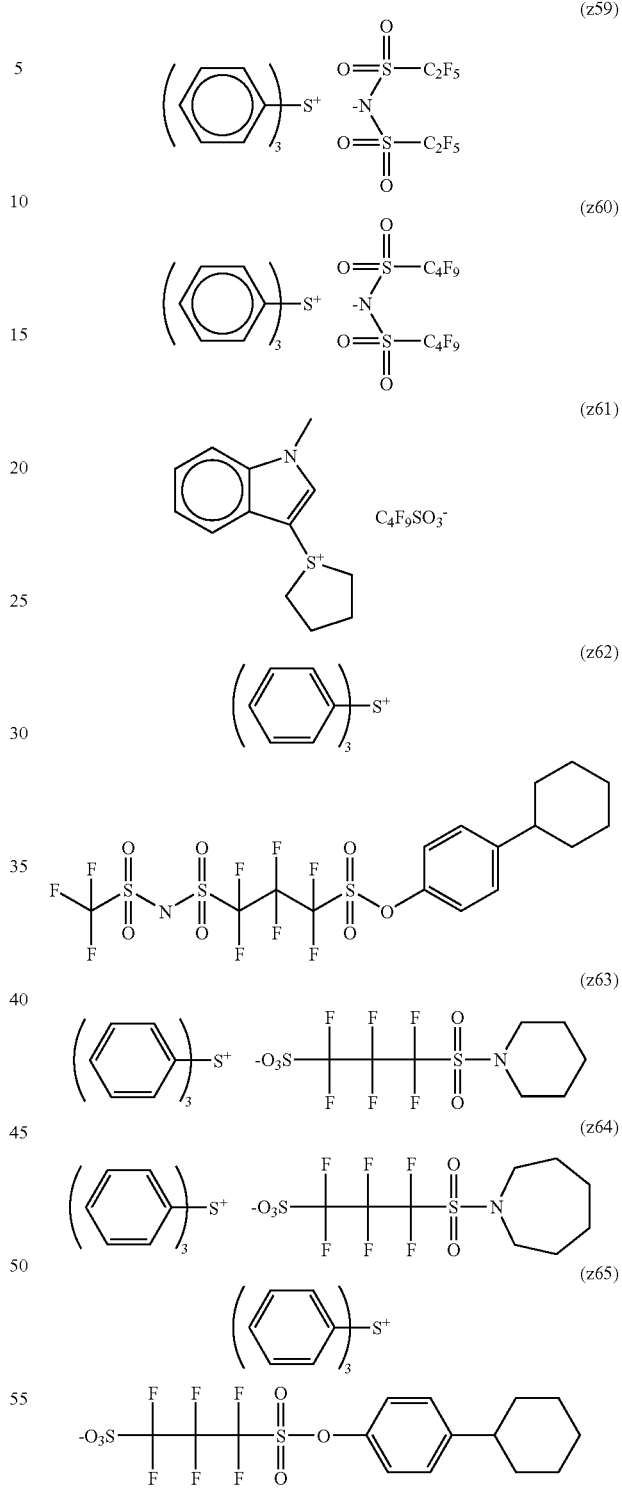
(Component (B): Resin of Which Solubility in an Alkali Developer is Changed Under the Action of an Acid)
The resin of which solubility in an alkali developer is changed under the action of an acid (hereinafter referred to as a "component (B)"), for use in the present invention, is a resin of which solubility in an alkali developer is changed by the effect of an acid generated from the compound capable of generating an acid upon irradiation with actinic rays or radiation.

The resist composition is a chemical amplification-type resist composition used with a light source (radiation source) having a wavelength of 250 nm or less, such as KrF excimer laser, ArF excimer laser, $F_2$ excimer laser, EUV (extreme ultraviolet light) and EB (electron beam), and any resin which is suitable for respective light sources may be used as the component (B).

Examples of the resin which can be used include the resins disclosed in JP-A-2005-10217, JP-A-11-84639 and Japanese Patent 3,116,751 for the positive resist used with a KrF excimer laser, the resins disclosed in JP-A-2003-302670 and JP-A-2005-37414 for the negative resist used with a KrF excimer laser, and the resins disclosed in JP-A-2005-37888, JP-A-2005-41857 and JP-A-2005-10217 for the positive resist used with an ArF excimer laser.

The resin as the component (B), which decomposes by the effect of an acid to increase the solubility in an alkali developer, is a resin having a group capable of decomposing by the effect of an acid (hereinafter sometimes referred to as an "acid-decomposable group") to produce an alkali-soluble group, in ether one or both of the main chain and the side chain of the resin. Of these, a resin having an acid-decomposable group in the side chain is preferred.

The group preferred as the acid-decomposable group is a group resulting from replacing the hydrogen atom of a —COOH or —OH group as an alkali-soluble group by a group which splits off by the effect of an acid.

In the present invention, the acid-decomposable group is preferably an acetal group or a tertiary ester group.

In the case where the acid-decomposable group is bonded as a side chain, the mother resin is an alkali-soluble resin having an —OH or —COOH group in the side chain. Examples thereof include an alkali-soluble resin described later.

The alkali dissolution rate of such an alkali-soluble resin is preferably 170 Å/sec or more, more preferably 330 Å/sec or more (Å is angstrom), as measured (at 23° C.) in 0.261N tetramethylammonium hydroxide (TMAH).

From this standpoint, the alkali-soluble resin is preferably an alkali-soluble resin having a hydroxystyrene structural unit, such as o-, m- or p-poly(hydroxystyrene) or its copolymer, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; or an alkali-soluble resin containing a repeating unit having a carboxyl group, such as (meth)acrylic acid and norbornene carboxylic acid.

Preferred examples of the repeating unit having an acid-decomposable group for use in the present invention include tert-butoxycarbonyloxystyrene, 1-alkoxyethoxystyrene and tertiary alkyl (meth)acrylate. Among these, 2-alkyl-2-adamantyl(meth)acrylate and dialkyl(1-adamantyl)methyl (meth)acrylate are more preferred.

The component (B) can be obtained by reacting a precursor of a group capable of decomposing by the effect of an acid with an alkali-soluble resin or by copolymerizing an alkali-soluble resin monomer having bonded thereto a group capable of decomposing by the effect of an acid with various monomers, and this is disclosed in European Patent 254853, JP-A-2-25850, JP-A-3-223860 and JP-A-4-251259.

In the case of irradiating the resist composition of the present invention with KrF excimer laser light, electron beam, X-ray or high-energy light at a wavelength of 50 nm or less (e.g., EUV), the resin as the component (B) preferably has a hydroxystyrene repeating unit, and the resin is more preferably a copolymer of hydroxystyrene/hydroxystyrene protected by an acid-decomposable group, or hydroxystyrene/tertiary alkyl (meth)acrylate.

Specific examples of the component (B) are set forth below, but the present invention is not limited thereto.

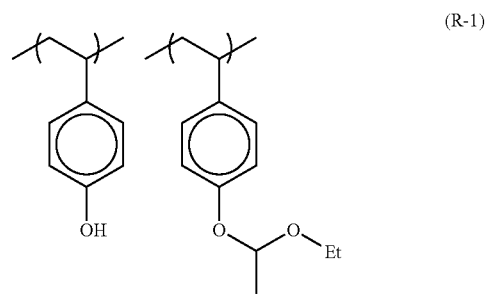

(R-1)

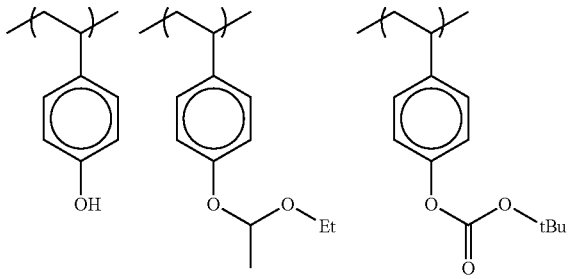

(R-2)

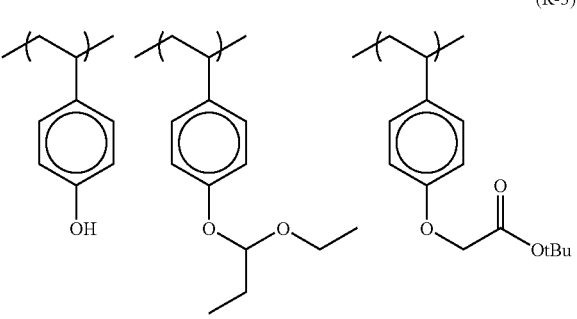

(R-3)

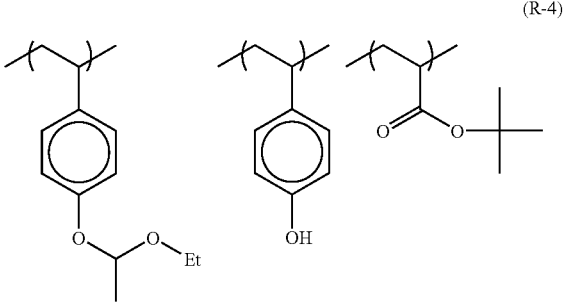

(R-4)

(R-5)
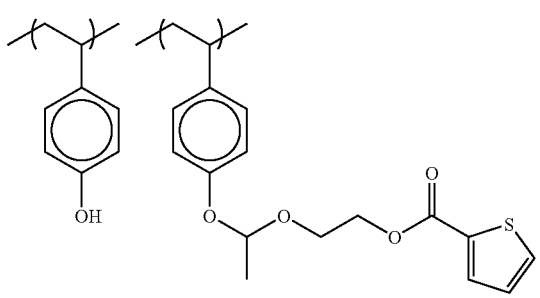
(R-6)
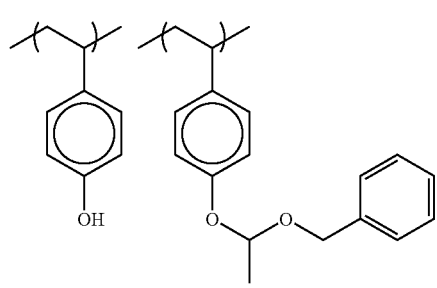
(R-7)
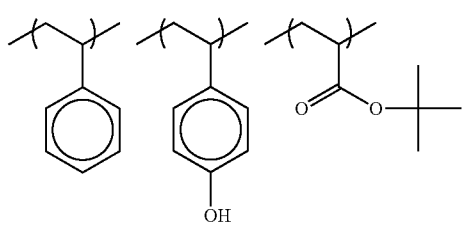
(R-8)
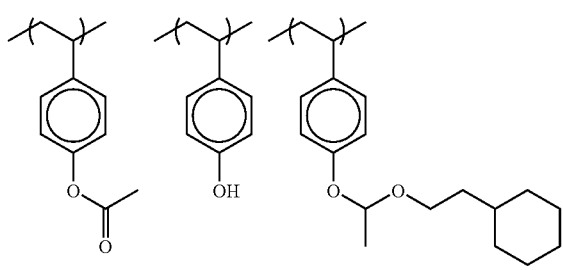
(R-9)
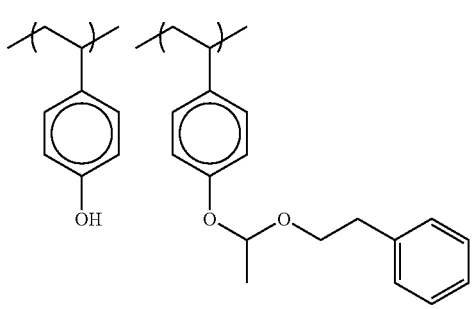
(R-10)
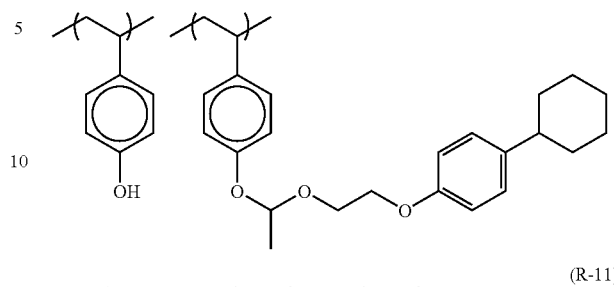
(R-11)
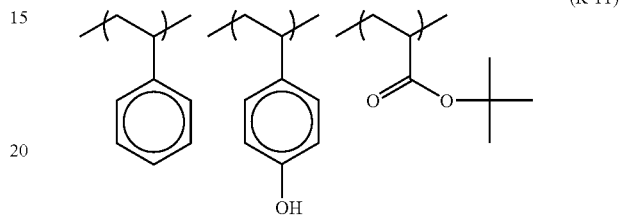
(R-12)
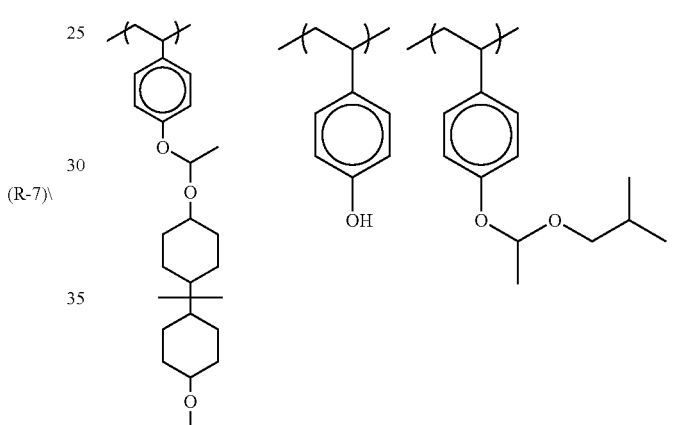
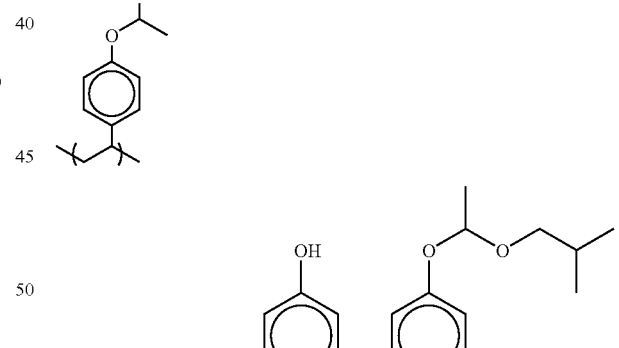
(R-13)
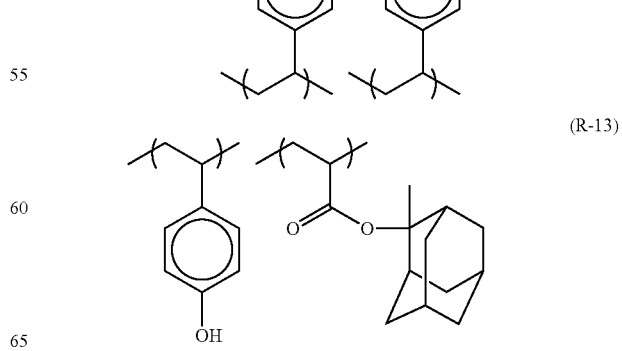

-continued

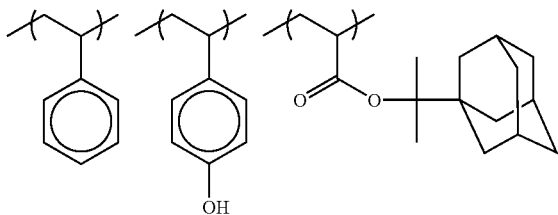
(R-14)

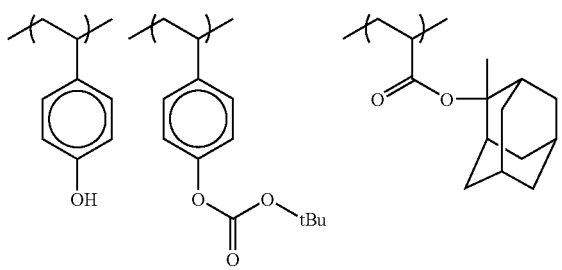
(R-15)

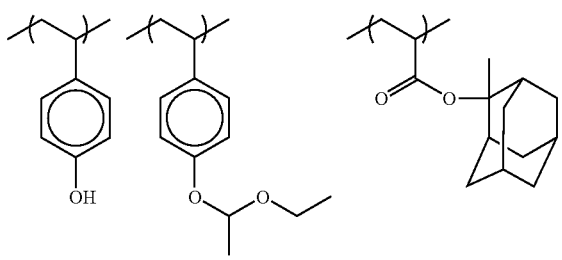
(R-16)

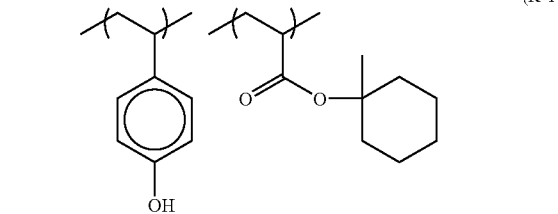
(R-17)

In these specific examples, "tBu" indicates a tert-butyl group.

The content of the acid-decomposable group is expressed by B/(B+S) using the number (B) of acid-decomposable groups in the resin and the number (S) of alkali-soluble groups not protected by a group which splits off by the effect of an acid. The content is preferably from 0.01 to 0.7, more preferably from 0.05 to 0.50, still more preferably from 0.05 to 0.40.

In the case of irradiating the positive resist composition of the present invention with ArF excimer laser light, the resin as the component (B) is preferably a resin having a monocyclic or polycyclic alicyclic hydrocarbon structure and being capable of decomposing under the action of an acid to increase the solubility in an alkali developer.

The resin having a monocyclic or polycyclic alicyclic hydrocarbon structure and being capable of decomposing under the action of an acid to increase the solubility in an alkali developer (hereinafter sometimes referred to as an "alicyclic hydrocarbon-based acid-decomposable resin") is preferably a resin containing at least one repeating unit selected from the group consisting of repeating units having an alicyclic hydrocarbon-containing partial structure represented by any one of the following formulae (pI) to (pV) and a repeating unit represented by the following formula (II-AB):

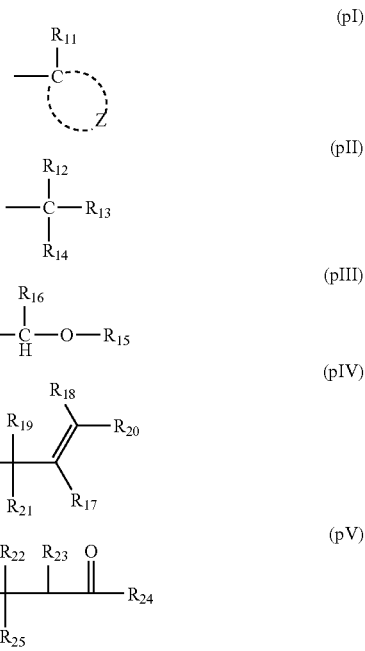

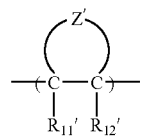

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming an alicyclic hydrocarbon group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having a carbon number of 1 to 4, or an alicyclic hydrocarbon group, provided that at least one of $R_{17}$ to $R_{21}$ represents a cycloalkyl group and that either one of $R_{19}$ and $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4, or an alicyclic hydrocarbon group, provided that at least one of $R_{22}$ to $R_{25}$ represents a cycloalkyl group. $R_{23}$ and $R_{24}$ may combine with each other to form a ring.

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB1) or (II-AB2):

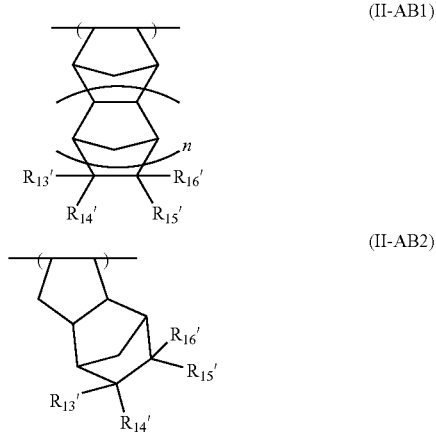

In formulae (II-AB1) and (II-AB2), $R_{13}'$ to $R_{16}'$ each independently represents a hydrogen atom, a halogen atom, a cyano group, a hydroxyl group, —COOH, —COOR$_5$, a group capable of decomposing under the action of an acid, —C(=O)—X-A'-R$_{17}'$, an alkyl group or a cycloalkyl group, and at least two members out of $R_{13}'$ to $R_{16}'$ may combine to form a ring.

R$_5$ represents an alkyl group, a cycloalkyl group or a group having a lactone structure.

X represents an oxygen atom, a sulfur atom, —NH—, —NHSO$_2$— or —NHSO$_2$NH—.

A' represents a sing bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

R$_6$ represents an alkyl group or a cycloalkyl group.

n represents 0 or 1.

In formulae (pI) to (pV), the alkyl group of $R_{12}$ to $R_{25}$ is a linear or branched alkyl group having from 1 to 4 carbon atoms, and examples thereof include a methyl group, an ethyl group, a propyl group, an n-butyl group, a sec-butyl group and a tert-butyl group.

The alicyclic hydrocarbon group of $R_{12}$ to $R_{25}$ and the alicyclic hydrocarbon group formed by Z together with the carbon atom may be monocyclic or polycyclic. Specific examples thereof include a group having a monocyclo, bicyclo, tricyclo or tetracyclo structure or the like with a carbon number of 5 or more. The carbon number thereof is preferably from 6 to 30, more preferably from 7 to 25. These alicyclic hydrocarbon groups each may have a substituent.

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl and alicyclic hydrocarbon groups each may further have a substituent. Examples of the substituent which the alkyl and alicyclic hydrocarbon groups each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl, alkoxy and alkoxycarbonyl groups and the like each may further have a substituent. Examples of the substituent which the alkyl, alkoxy and alkoxycarbonyl groups and the like each may further have include a hydroxyl group, a halogen atom and an alkoxy group.

The structures represented by formulae (pI) to (pV) each can be used for the protection of an alkali-soluble group in the resin. The alkali-soluble group includes various groups known in this technical field.

Specific examples of the structure where an alkali-soluble group is protected include structures where the hydrogen atom of a carboxylic acid group, a sulfonic acid group, a phenol group or a thiol group is replaced by the structure represented by any one of formulae (pI) to (pV). Among these, preferred are structures where the hydrogen atom of a carboxylic acid group or a sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

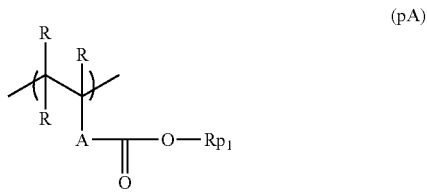

In formula (pA), R represents a hydrogen atom, a halogen atom or a linear or branched alkyl group having from 1 to 4 carbon atoms, and the plurality of R's may be the same or different.

A represents a single bond, or one or a combination of two or more groups selected from the group consisting of an alkylene group, an ether group, a thioether group, a carbonyl group, an ester group, an amido group, a sulfonamido group, a urethane group and a urea group. A is preferably a single bond.

Rp$_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl(meth)acrylate.

Specific examples of the repeating unit represented by formula (pA) are set forth below.

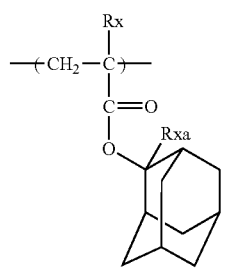

-continued
2
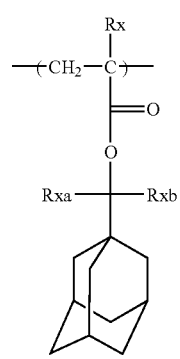
3
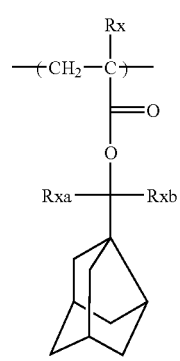
4
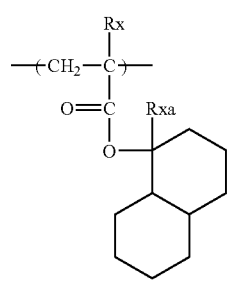
5
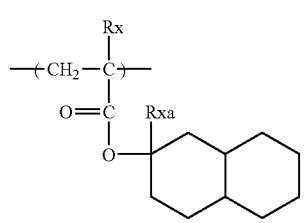
6
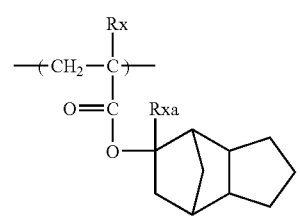
7
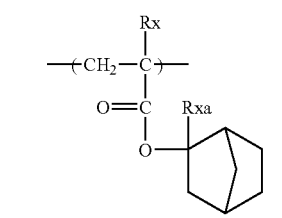
-continued
8
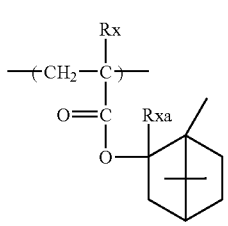
9
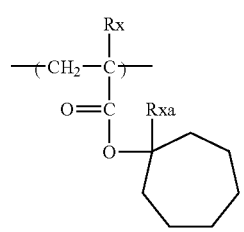
10
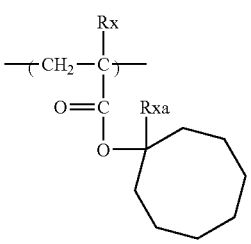
11
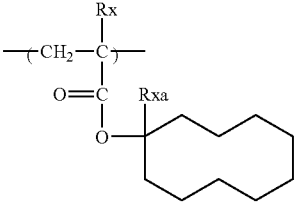
12
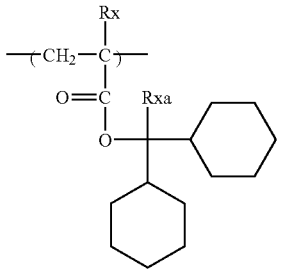
13
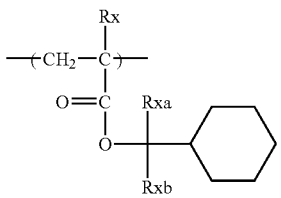
14
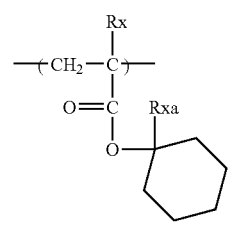

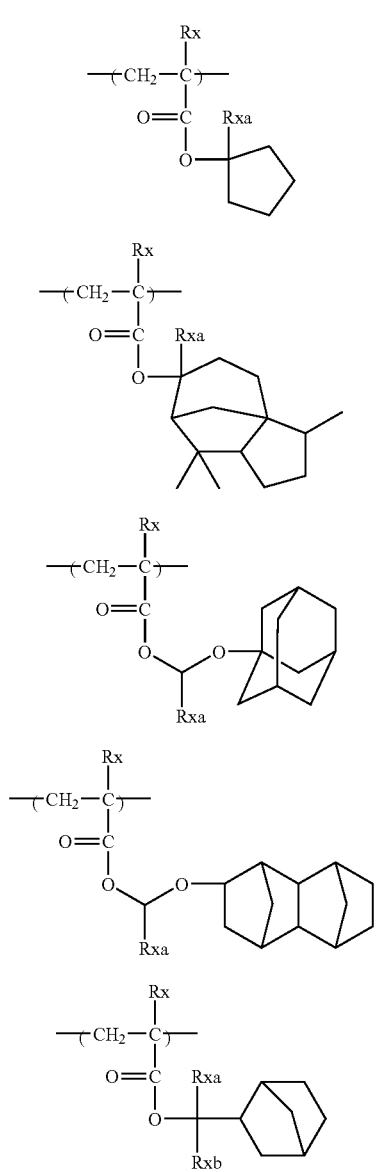

In the structural formulae above, Rx represents H, CH$_3$, CF$_3$ or CH$_2$OH, and Rxa and Rxb each independently represents an alkyl group having a carbon number of 1 to 4.

Examples of the halogen atom of R$_{11}$' and R$_{12}$' in formula (II-AB) include a chlorine atom, a bromine atom, a fluorine atom and an iodine atom.

The alkyl group of R$_{11}$' and R$_{12}$' is preferably a linear or branched alkyl group having a carbon number of 1 to 10, and examples thereof include a methyl group, an ethyl group, an n-propyl group, an isopropyl group and a linear or branched butyl, pentyl, hexyl or heptyl group.

The atomic group of Z' for forming an alicyclic structure is an atomic group for forming, in the resin, an alicyclic hydrocarbon repeating unit which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of R$_{12}$ to R$_{25}$ in formulae (pI) to (pV).

The alicyclic hydrocarbon skeleton may have a substituent, and examples of the substituent include R$_{13}$' to R$_{16}$' in formulae (II-AB 1) and (II-AB2).

In the alicyclic hydrocarbon-based acid-decomposable resin, the acid-decomposable group may be contained in at least one repeating unit out of the repeating units having an alicyclic hydrocarbon-containing partial structure represented by any one of formulae (pI) to (pV), the repeating unit represented by formula (II-AB), and the repeating unit comprising a copolymerization component described later.

Various substituents R$_{13}$' to R$_{16}$' in formulae (II-AB1) and (II-AB2) may work out to a substituent of the atomic group for forming an alicyclic structure in formula (II-AB) or the atomic group Z for forming a crosslinked alicyclic structure.

Specific examples of the repeating units represented by formulae (II-AB1) and (II-AB2) are set forth below, but the present invention is not limited thereto.

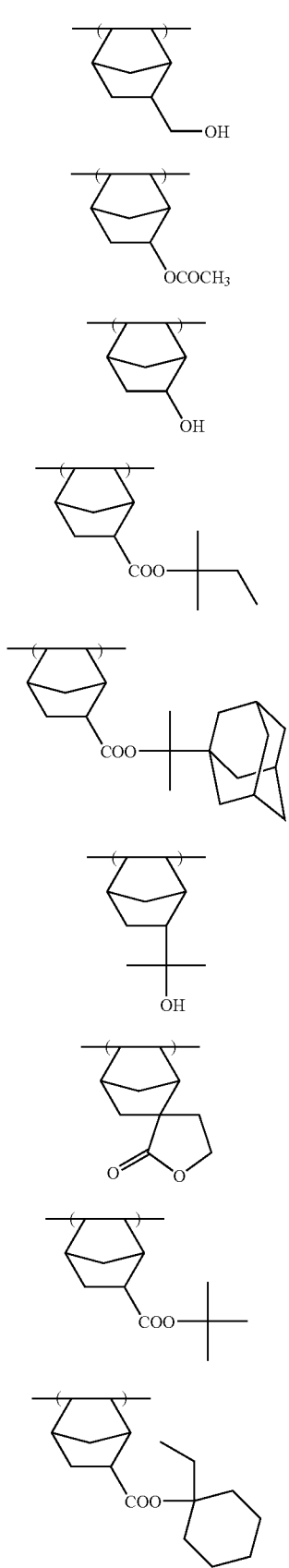
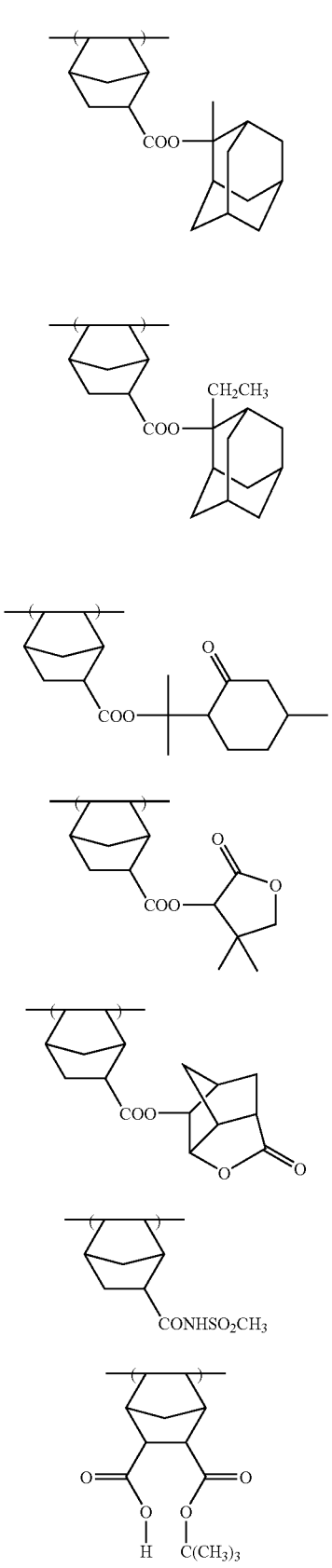

-continued

[II-24]
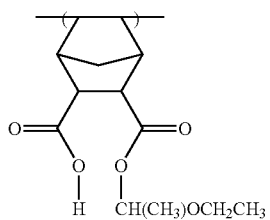

[II-25]
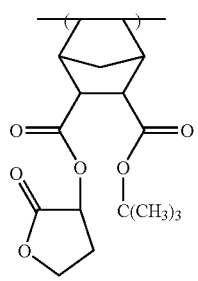

[II-26]
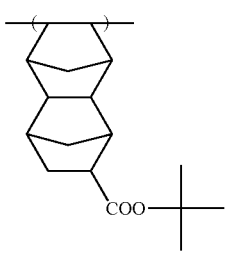

[II-27]
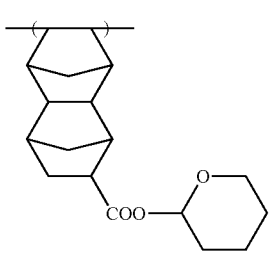

[II-28]
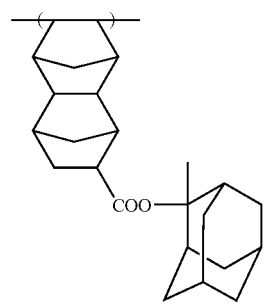

[II-29]
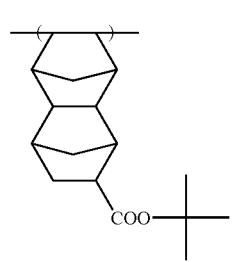

[II-30]
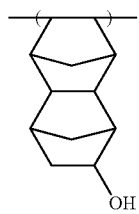

[II-31]
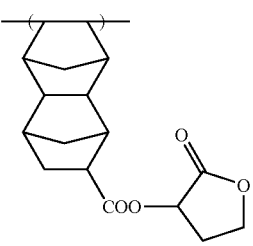

[II-32]
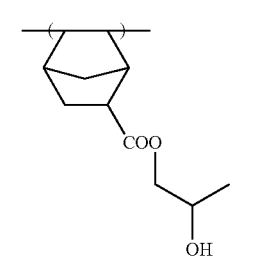

The alicyclic hydrocarbon-based acid-decomposable resin preferably contains a repeating unit having a lactone group. As for the lactone group, any group may be used as long as it has a lactone structure, but a group having a 5-, 6- or 7-membered ring lactone structure is preferred. The 5-, 6- or 7-membered ring lactone structure is preferably condensed with another ring structure in the form of forming a bicyclo or spiro structure. The alicyclic hydrocarbon-based acid-decomposable resin for use in the present invention more preferably has a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By virtue of using a specific lactone structure, the line edge roughness and development defect are improved.

LC1-1
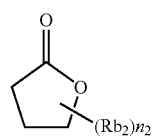

LC1-2
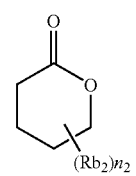

-continued

LC1-3
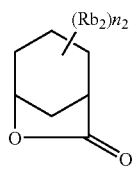

LC1-4
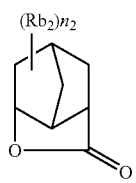

LC1-5
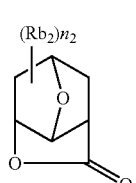

LC1-6
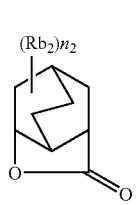

LC1-7
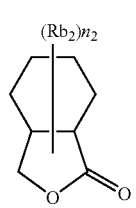

LC1-8
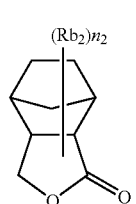

LC1-9
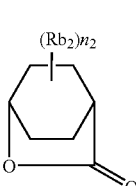

LC1-10
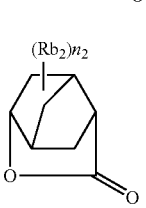

-continued

LC1-11
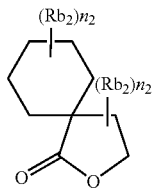

LC1-12
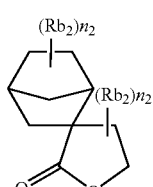

LC1-13
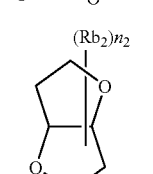

LC1-14

LC1-15

LC1-16
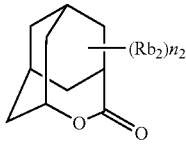

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —COOR$_5$ is a group represented by any one of formulae (LC1-1) to (LC1-16)), and a repeating unit represented by the following formula (AI):

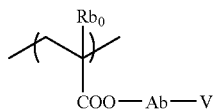

(AI)

In formula (AI), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group of $Rb_0$ may have a substituent. Preferred examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -Ab$_1$-CO$_2$—.

Ab$_1$ is a linear or branched alkylene group or a monocyclic or polycyclic cycloalkylene group, preferably a methylene group, an ethylene group, a cyclohexyl residue, an adamantyl residue or a norbornyl residue.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one kind of an optical isomer, the optical purity (ee) thereof is preferably 90 or more, more preferably 95 or more.

Specific examples of the repeating unit containing a group having a lactone structure are set forth below, but the present invention is not limited thereto.

(In formulae, Rx is H, CH3, CH2OH or CF3.)

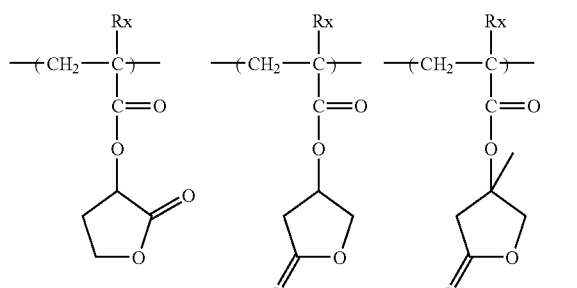

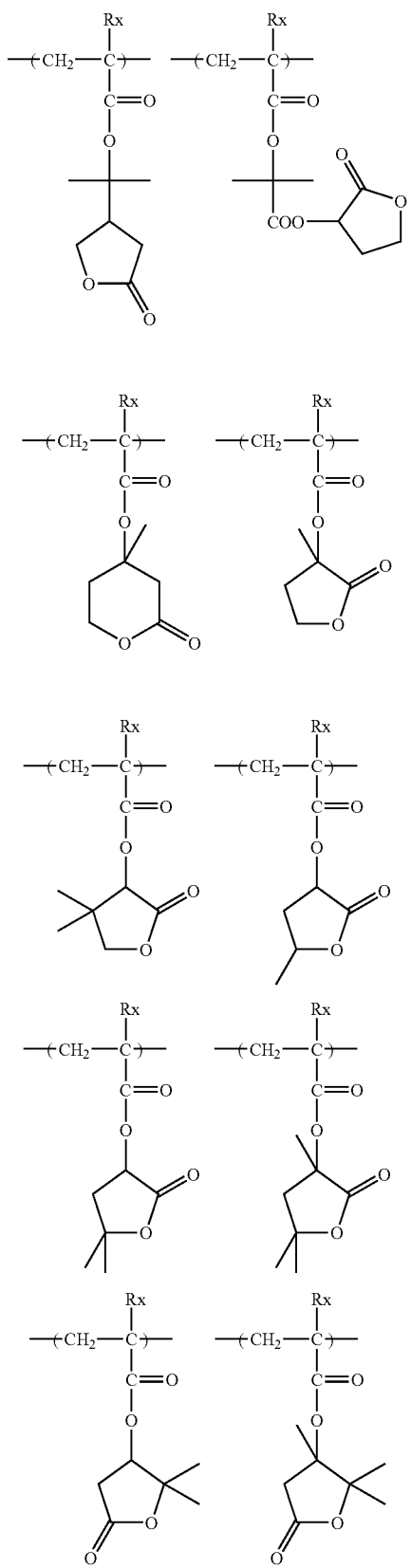

-continued
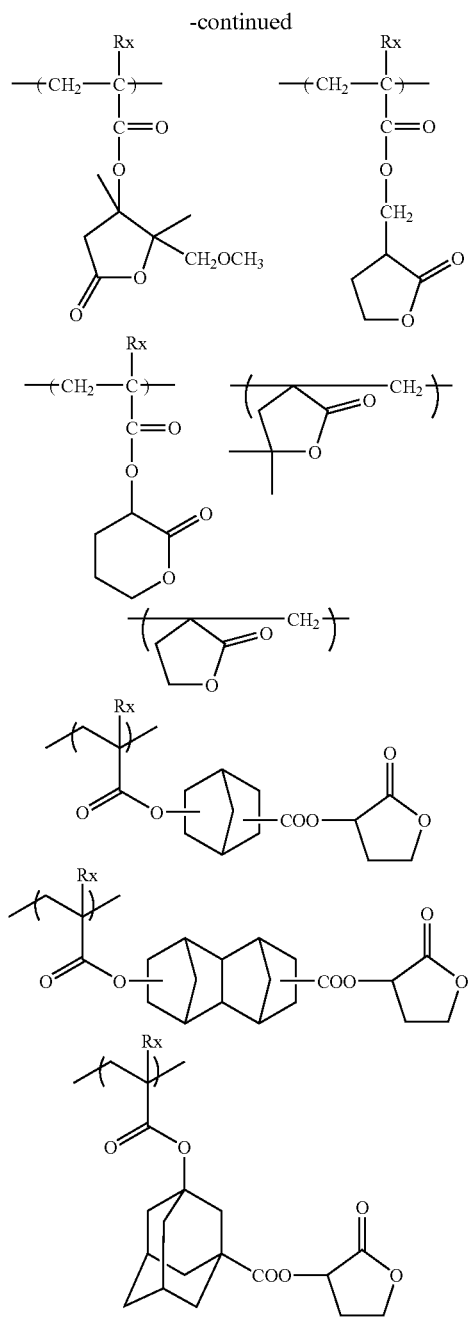
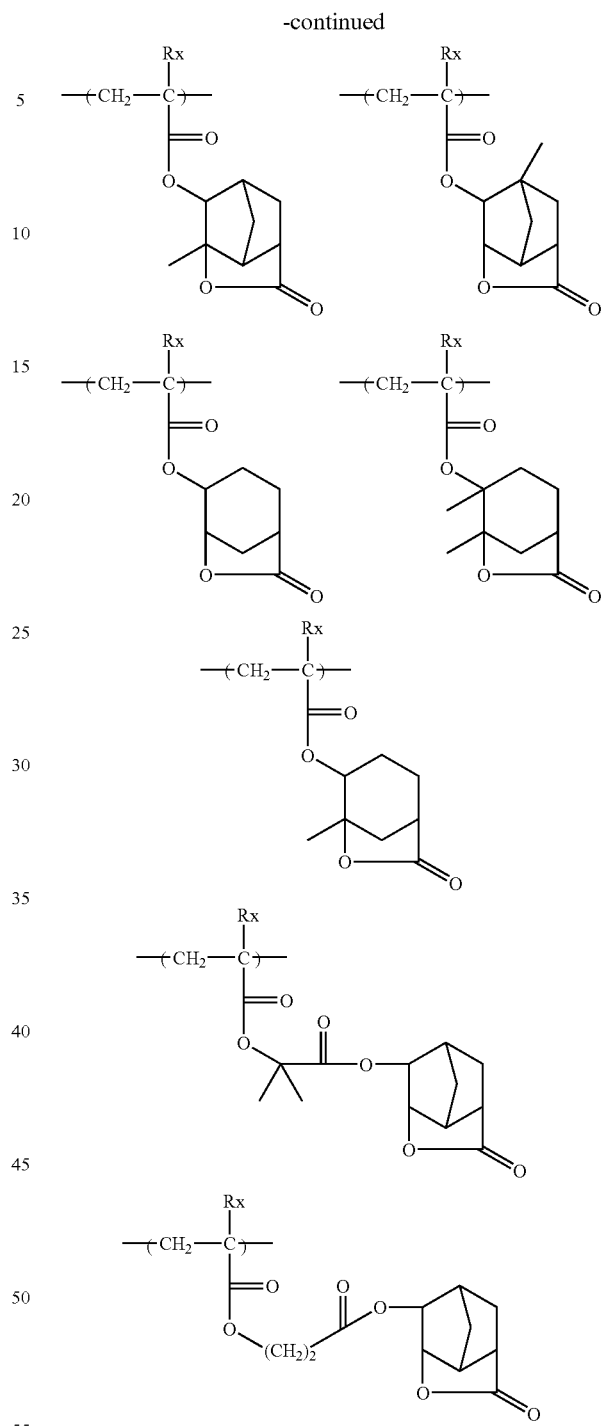
(In formulae, Rx is H, CH3, CH2OH or CF3.)
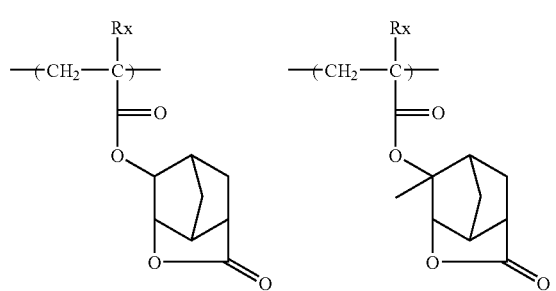
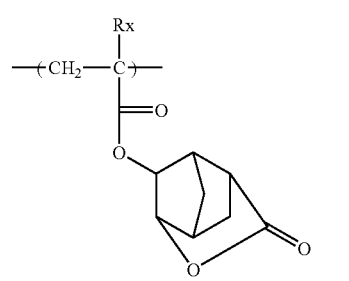

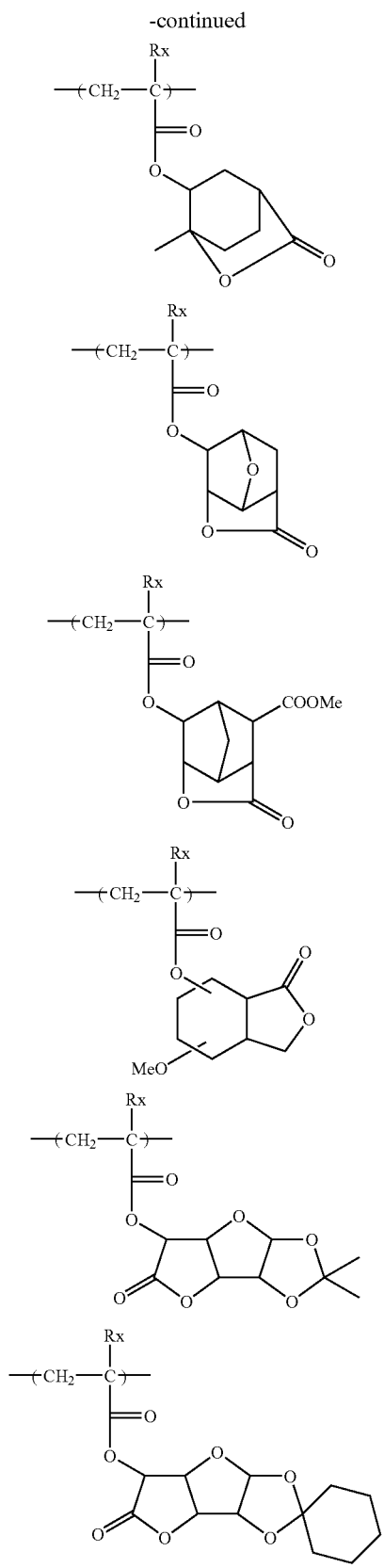
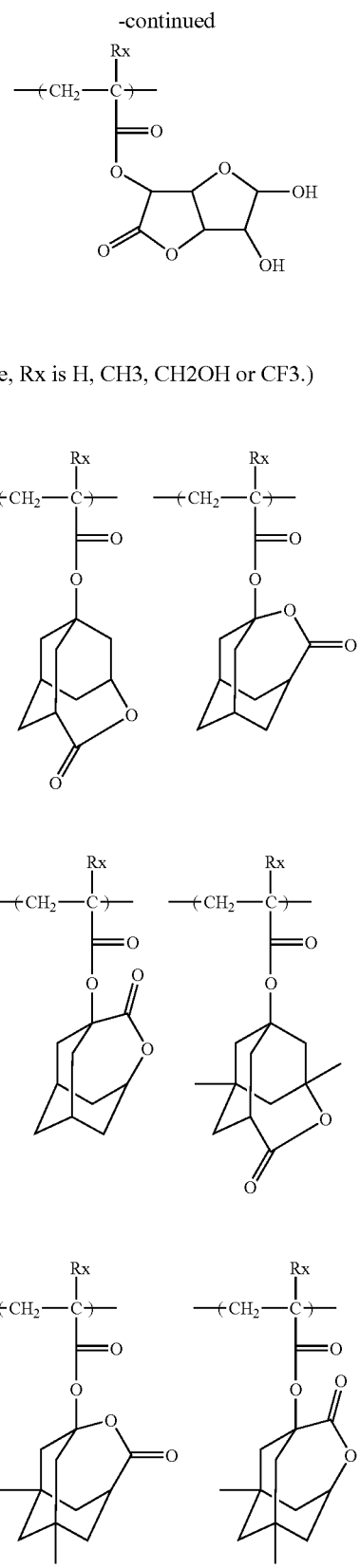
(In formulae, Rx is H, CH3, CH2OH or CF3.)

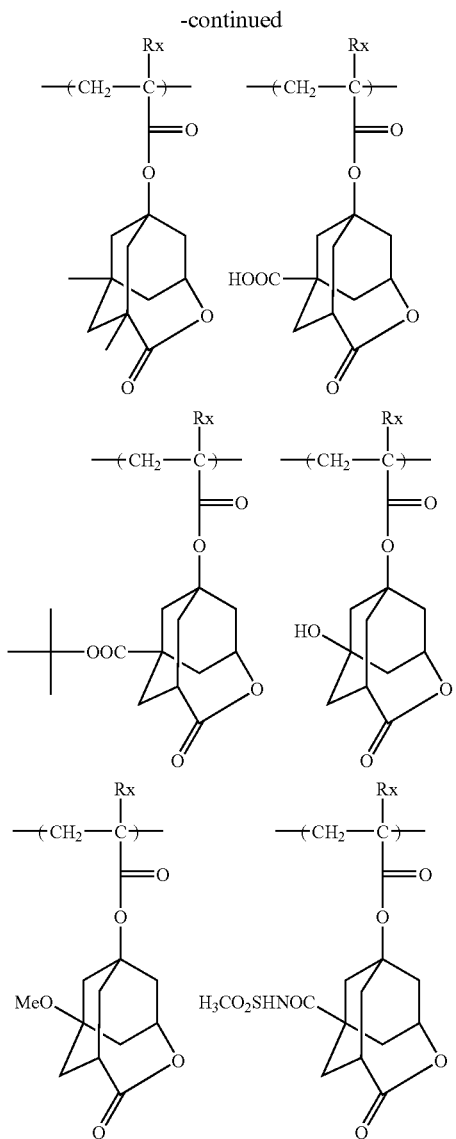

The alicyclic hydrocarbon-based acid-decomposable resin preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group.

Examples of the alicyclic hydrocarbon structure substituted by a polar group include structures represented by the following formulae (VIIa) and (VIIb):

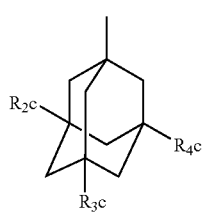

(VIIa)

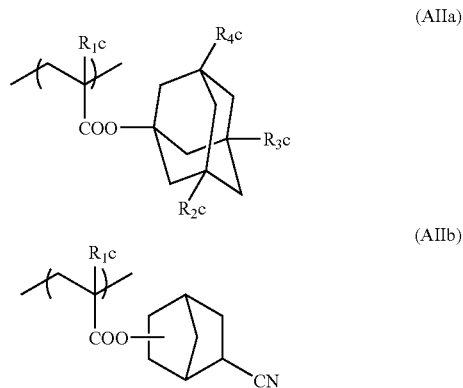

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two member out of $R_{2c}$ to $R_{4c}$ is a hydroxyl group with the remaining being a hydrogen atom is preferred, and a structure where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, $R_5$ of —COOR$_5$ is a group represented by formula (VIIa) or (VIIb)), and repeating units represented by the following formulae (AIIa) and (AIIb):

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating units represented by formulae (AIIa) and (AIIb) having an alicyclic hydrocarbon structure substituted by a polar group are set forth below, but the present invention is not limited thereto.

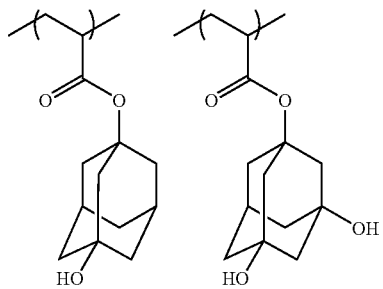

-continued

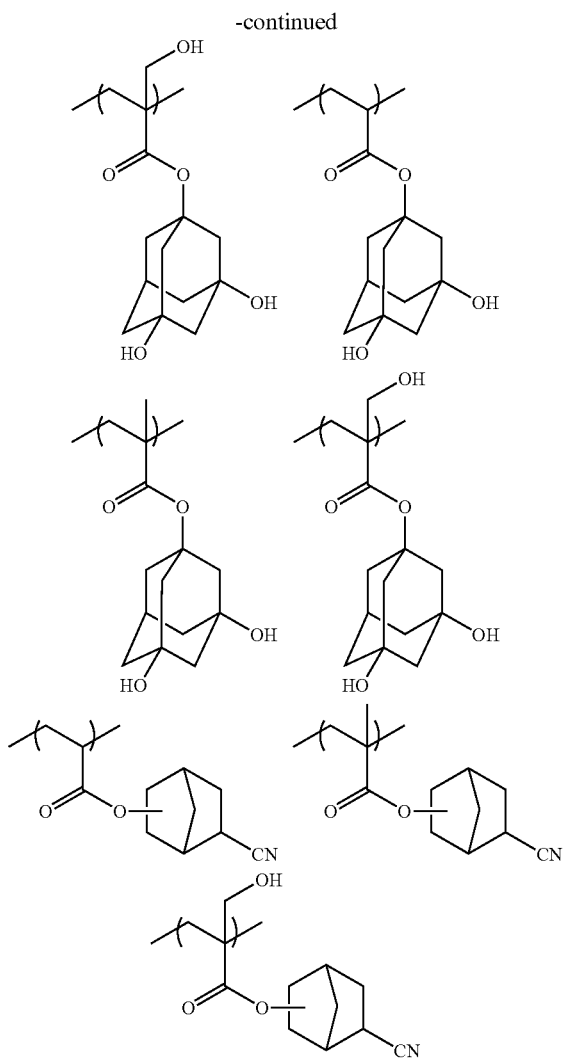

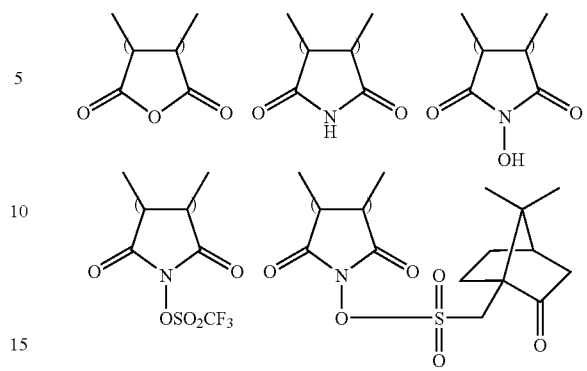

The alicyclic hydrocarbon-based acid-decomposable resin preferably contains a repeating unit having an alkali-soluble group, more preferably a repeating unit having a carboxyl group. By virtue of containing such a repeating unit, the resolution increases in usage of forming contact holes. As for the repeating unit having a carboxyl group, both a repeating unit where a carboxyl group is directly bonded to the resin main chain, such as repeating unit by an acrylic acid or a methacrylic acid, and a repeating unit where a carboxyl group is bonded to the resin main chain through a linking group, are preferred. The linking group may have a monocyclic or polycyclic hydrocarbon structure. An acrylic acid and a methacrylic acid are most preferred.

The alicyclic hydrocarbon-based acid-decomposable resin may contain a repeating unit having from 1 to 3 groups represented by the following formula (F1). By virtue of this repeating unit, the line edge roughness performance is enhanced.

The alicyclic hydrocarbon-based acid-decomposable resin may contain a repeating unit represented by the following formula (VIII):

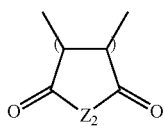
(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

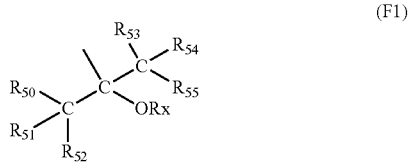
(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like. The alkyl group is preferably an alkyl group having a carbon number of 1 to 3, and examples thereof include a methyl group and a trifluoromethyl group.

It is preferred that $R_{50}$ to $R_{55}$ all are a fluorine atom.

The organic group represented by Rx is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

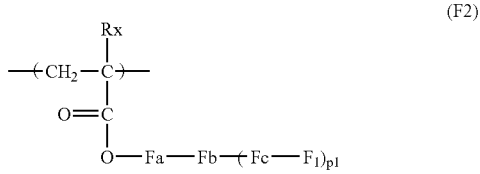

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a group represented formula (F1) are set forth below.

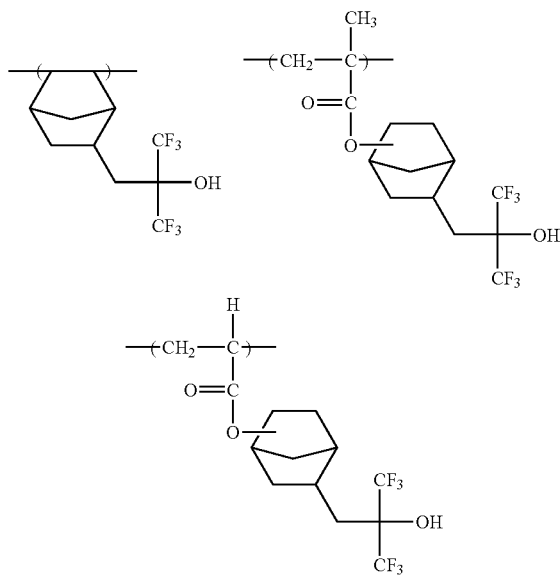

The alicyclic hydrocarbon-based acid-decomposable resin may contain, in addition to the above-described repeating structural units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomer corresponding to the above-described various repeating structural units may be copolymerized.

In the alicyclic hydrocarbon-based acid-decomposable resin, the molar ratio of respective repeating structural units contained is appropriately selected to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative structure and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 25 to 70 mol %, more preferably from 35 to 65 mol %, still more preferably from 40 to 60 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit. based on the monomer as the further copolymerization component, in the resin, can also be appropriately selected according to the desired resist performance but generally, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

When the resist composition of the present invention is used for exposure with ArF, the resin preferably has no aromatic group in view of transparency to ArF light.

The alicyclic hydrocarbon-based acid-decomposable resin for use in the present invention is preferably a resin where all repeating units are composed of a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units.

The alicyclic hydrocarbon-based acid-decomposable resin for use in the present invention is more preferably a ternary copolymerization polymer comprising from 25 to 50% of the repeating unit having an alicyclic hydrocarbon-containing partial structure represented by any one of formulae (pI) to (pV), from 25 to 50% of the repeating unit having a lactone structure and from 5 to 30% of the repeating unit having an alicyclic hydrocarbon structure substituted by a polar group, or a quaternary copolymerization polymer additionally comprising from 5 to 20% of the repeating unit having a carboxyl group or a structure represented by formula (F1).

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is preferably performed by using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C.

In the case of using the composition of the present invention for the upper layer resist of a multilayer resist, the resin as the component (B) preferably has a silicon atom.

As for the resin having a silicon atom and being capable of decomposing under the action of an acid to increase the solubility in an alkali developer, a resin having a silicon atom at least in either main chain or side chain can be used. Examples of the resin having a siloxane structure in the side chain of the resin include a copolymer of an olefin-based monomer having a silicon atom in the side chain and a (meth) acrylic acid-based monomer having a maleic anhydride and an acid-decomposable group in the side chain.

The resin having a silicon atom is preferably a resin having a trialkylsilyl structure or a monocyclic or polycyclic siloxane structure, more preferably a resin containing a repeating unit having a structure represented by any one of the following formulae (SS-1) to (SS-4), still more preferably a resin containing a (meth)acrylic acid ester-based, vinyl-based or acryl-based repeating unit having a structure represented by any one of formulae (SS-1) to (SS-4).

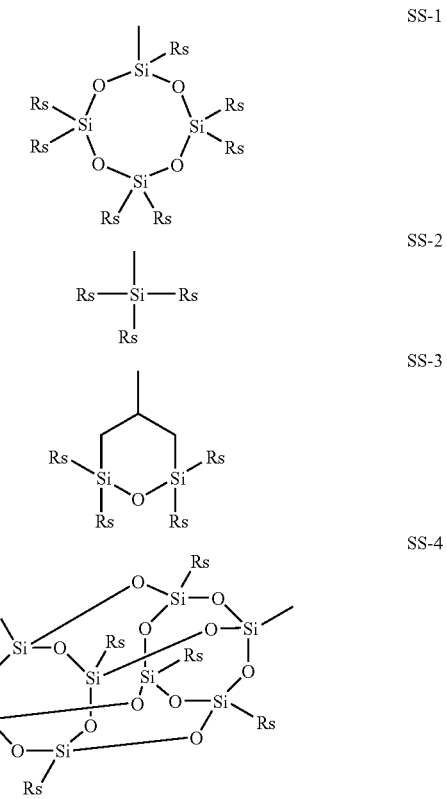

In formulae (SS-1) to (SS-4), Rs represents an alkyl group having a carbon number of 1 to 5 and is preferably a methyl group or an ethyl group.

The resin having a silicon atom is preferably a resin containing two or more different repeating units having a silicon atom, more preferably a resin containing both (Sa) a repeating unit having from 1 to 4 silicon atoms and (Sb) a repeating unit having from 5 to 10 silicon atoms, still more preferably a resin containing at least one repeating unit having a structure represented by any one of formulae (SS-1) to (SS-3) and a repeating unit having a structure represented by formula (SS-4).

In the case of irradiating the resist composition of the present invention with $F_2$ excimer laser light, the resin as the component (B) is preferably a resin having a structure that a fluorine atom is substituted to the main chain and/or the side chain of the polymer skeleton, and being capable of decomposing under the action of an acid to increase the solubility in an alkali developer (hereinafter sometimes referred to as a "fluorine group-containing resin"), more preferably a resin containing a hydroxyl group with the 1-position being substituted by a fluorine atom or a fluoroalkyl group or containing a group where the hydroxyl group with the 1-position being substituted by a fluorine atom or a fluoroalkyl group is protected by an acid-decomposable group, and still more preferably a resin having a hexafluoro-2-propanol structure or a structure that the hydroxyl group of hexafluoro-2-propanol is protected by an acid-decomposable group. By virtue of introducing a fluorine atom, the transparency to far ultraviolet light, particularly $F_2$ (157 nm) light, can be enhanced.

Preferred examples of the fluorine group-containing resin as the acid-decomposable resin (B) include a resin having at least one repeating unit represented by the following formulae (FA) to (FG):

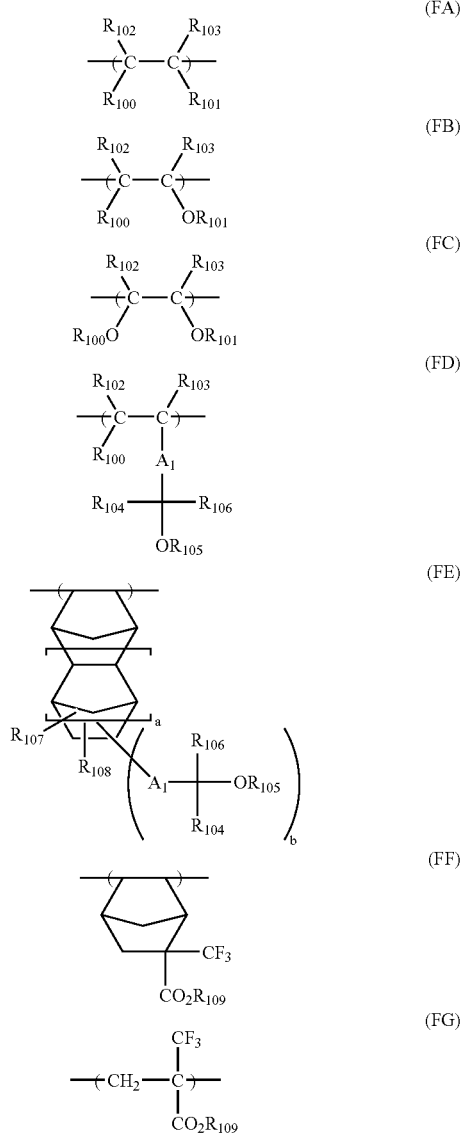

In these formulae, $R_{100}$ to $R_{103}$ each represents a hydrogen atom, a fluorine atom, an alkyl group or an aryl group.

$R_{104}$ and $R_{106}$ each is a hydrogen atom, a fluorine atom or an alkyl group, and at least either one of $R_{104}$ and $R_{106}$ is a fluorine atom or a fluoroalkyl group. $R_{104}$ and $R_{106}$ are preferably both a trifluoromethyl group.

$R_{105}$ is a hydrogen atom, an alkyl group, a cycloalkyl group, an acyl group, an alkoxycarbonyl group or a group capable of decomposing under the action of an acid.

$A_1$ is a single bond, a divalent linking group such as alkylene group, cycloalkylene group, alkenylene group, arylene group, —OCO—, —COO— and —CON($R_{24}$)—, or a linking group comprising a plurality of members of these groups. $R_{24}$ is a hydrogen atom or an alkyl group.

$R_{107}$ and $R_{108}$ each is a hydrogen atom, a halogen atom, an alkyl group, an alkoxy group, an alkoxycarbonyl group or a group capable of decomposing under the action of an acid.

$R_{109}$ is a hydrogen atom, an alkyl group, a cycloalkyl group or a group capable of decomposing under the action of an acid.

a represents 0 or 1.

b is 0, 1 or 2.

In formulae (FA) and (FC), $R_{100}$ and $R_{101}$ may form a ring through an alkylene group (having a carbon number of 1 to 5) which may be substituted by fluorine.

The repeating units represented by formulae (FA) to (FG) each contains at least one fluorine atom, preferably 3 or more fluorine atoms, per one repeating unit.

In formulae (FA) to (FG), the alkyl group is, for example, an alkyl group having a carbon number of 1 to 8, and specific preferred examples thereof include a methyl group, an ethyl group, a propyl group, an n-butyl group, a sec-butyl group, a hexyl group, a 2-ethylhexyl group and an octyl group.

The cycloalkyl group may be monocyclic or polycyclic. The monocyclic type is preferably a cycloalkyl group having a carbon number of 3 to 8, such as cyclopropyl group, cyclopentyl group, cyclohexyl group, cycloheptyl group and cyclooctyl group. The polycyclic type is preferably a cycloalkyl group having a carbon number of 6 to 20, such as adamantyl group, norbornyl group, isoboronyl group, camphanyl group, dicyclopentyl group, α-pinel group, tricyclodecanyl group, tetracyclododecyl group and androstanyl group. In these monocyclic or polycyclic cycloalkyl groups, the carbon atom may be substituted by a heteroatom such as oxygen atom.

The fluoroalkyl group is, for example, a fluoroalkyl group having a carbon number of 1 to 12, and specific preferred examples thereof include a trifluoromethyl group, a perfluoroethyl group, a perfluoropropyl group, a perfluorobutyl group, a perfluorohexyl group, a perfluorooctyl group, a perfluorooctylethyl group and a perfluorododecyl group.

The aryl group is, for example, an aryl group having a carbon number of 6 to 15, and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The alkoxy group is, for example, an alkoxy group having a carbon number of 1 to 8, and specific preferred examples thereof include a methoxy group, an ethoxy group, an n-propoxy group, an iso-propoxy group, a butoxy group, a pentoxy group, an allyloxy group and an octoxy group.

The acyl group is, for example, an acyl group having a carbon number of 1 to 10, and specific preferred examples thereof include a formyl group, an acetyl group, a propanoyl group, a butanoyl group, a pivaloyl group, an octanoyl group and a benzoyl group.

The alkoxycarbonyl group is preferably a secondary alkoxycarbonyl group, more preferably a tertiary alkoxycarbonyl group, such as i-propoxycarbonyl group, tert-butoxycarbonyl group, tert-amyloxycarbonyl group and 1-methyl-1-cyclohexyloxycarbonyl group.

The halogen atom includes, for example, a fluorine atom, a chlorine atom, a bromine atom and an iodine atom.

The alkylene group is preferably an alkylene group having a carbon number of 1 to 8, such as methylene group, ethylene group, propylene group, butylene group, hexylene group and octylene group.

The alkenylene group is preferably an alkenylene group having a carbon number of 2 to 6, such as ethenylene group, propenylene group and butenylene group.

The cycloalkylene group is preferably a cycloalkylene group having a carbon number of 5 to 8, such as cyclopentylene group and cyclohexylene group.

The arylene group is preferably an arylene group having a carbon number of 6 to 15, such as phenylene group, tolylene group and naphthylene group.

These groups each may have a substituent, and examples of the substituent include those having active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

Here, the alkyl group, cycloalkyl group and aryl group include those described above, and the alkyl group may be further substituted by a fluorine atom or a cycloalkyl group.

Examples of the group capable of decomposing under the action of an acid to exhibit alkali solubility, contained in the fluorine group-containing resin of the present invention, include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) and —COO—C($R_{36}$)($R_{37}$)(O$R_{39}$).

$R_{36}$ to $R_{39}$ each represents an alkyl group, a cycloalkyl group, an aryl group, an aralkyl group or an alkenyl group, and $R_{01}$ and $R_{02}$ each represents a hydrogen atom, an alkyl group, a cycloalkyl group, an alkenyl group (e.g., vinyl, allyl, butenyl, cyclohexenyl), an aralkyl group (e.g., benzyl, phenethyl, naphthylmethyl), or an aryl group.

Specific preferred examples include an ether or ester group of a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal or acetal ester group such as 1-alkoxy-1-ethoxy group and tetrahydropyranyl group, a tert-alkylcarbonate group, and a tert-alkylcarbonylmethoxy group.

Specific examples of the repeating structural units represented by formulae (FA) to (FG) are set forth below, but the present invention is not limited thereto.

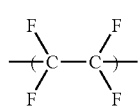

(F-1)

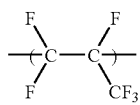

(F-2)

-continued

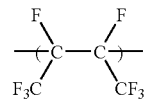

(F-3)

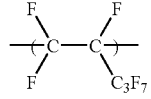

(F-4)

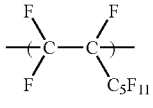

(F-5)

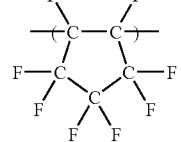

(F-6)

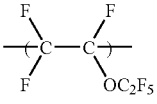

(F-7)

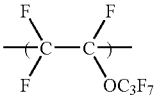

(F-8)

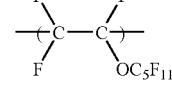

(F-9)

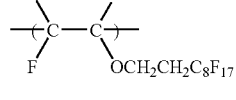

(F-10)

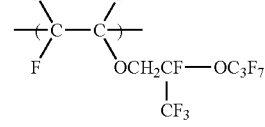

(F-11)

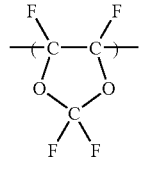

(F-12)

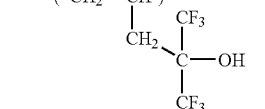

(F-13)

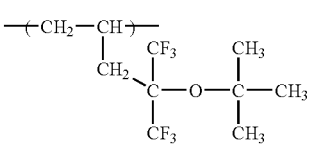

(F-14)

-continued (F-15), (F-16), (F-17), (F-18), (F-19), (F-20), (F-21), (F-22), (F-23), (F-24), (F-25), (F-26), (F-27)

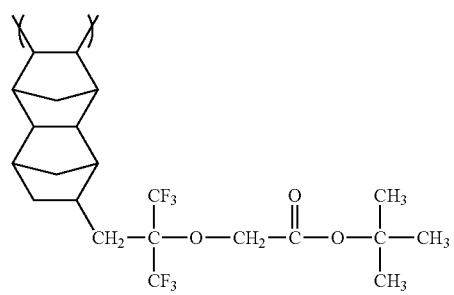
(F-28)
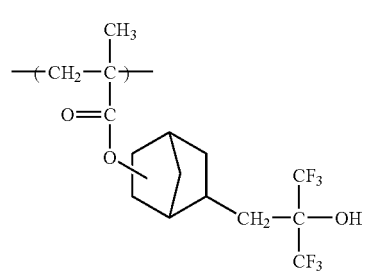
(F-29)
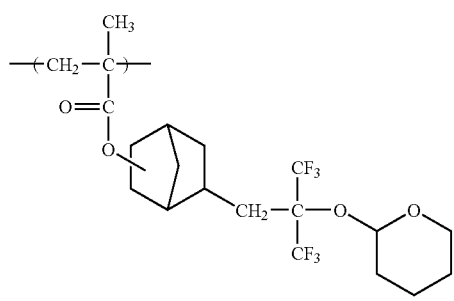
(F-30)
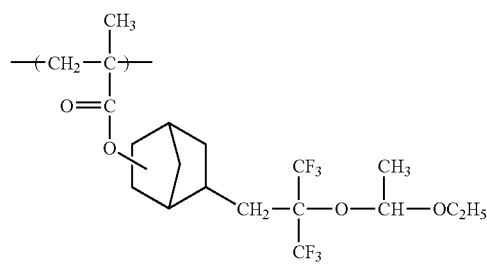
(F-31)
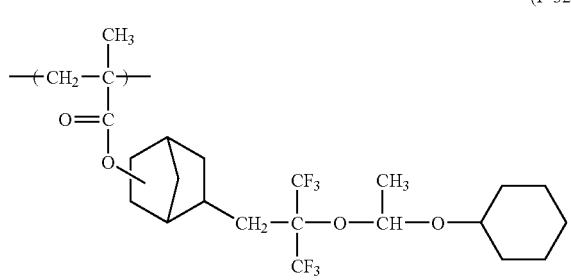
(F-32)
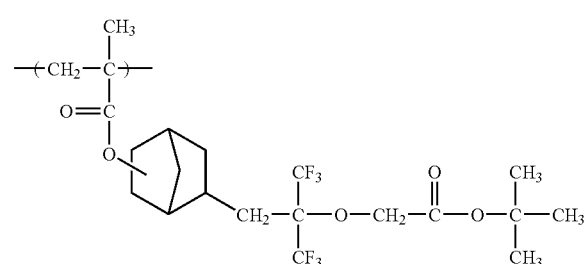
(F-33)
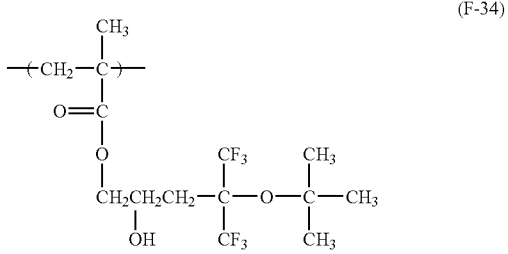
(F-34)
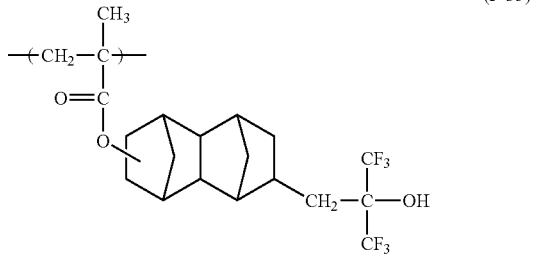
(F-35)
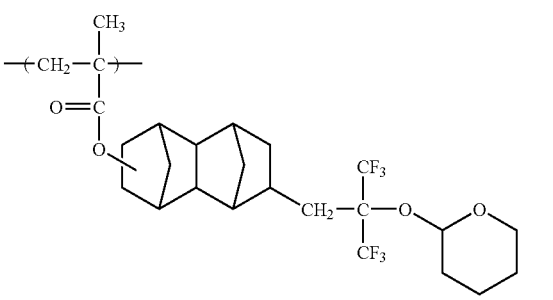
(F-36)
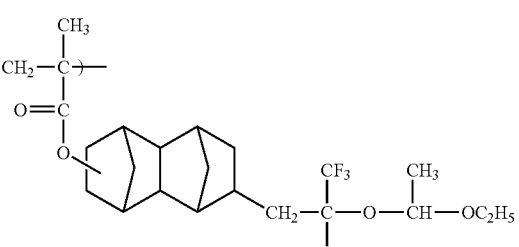
(F-37)

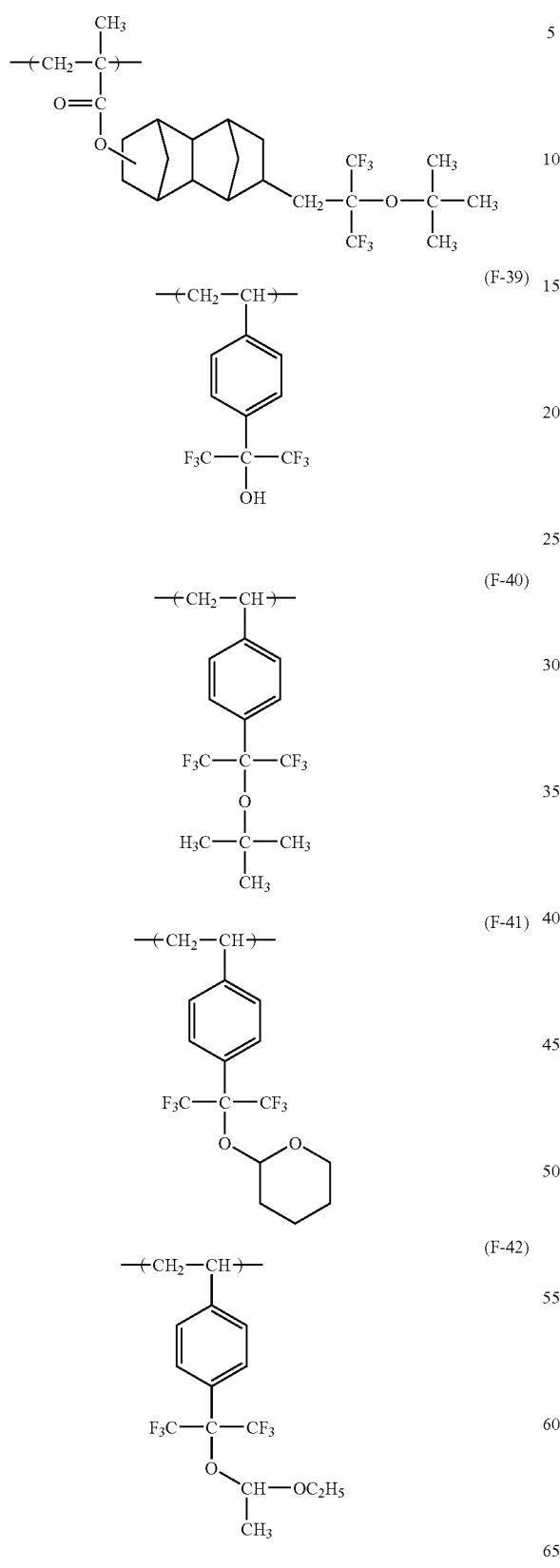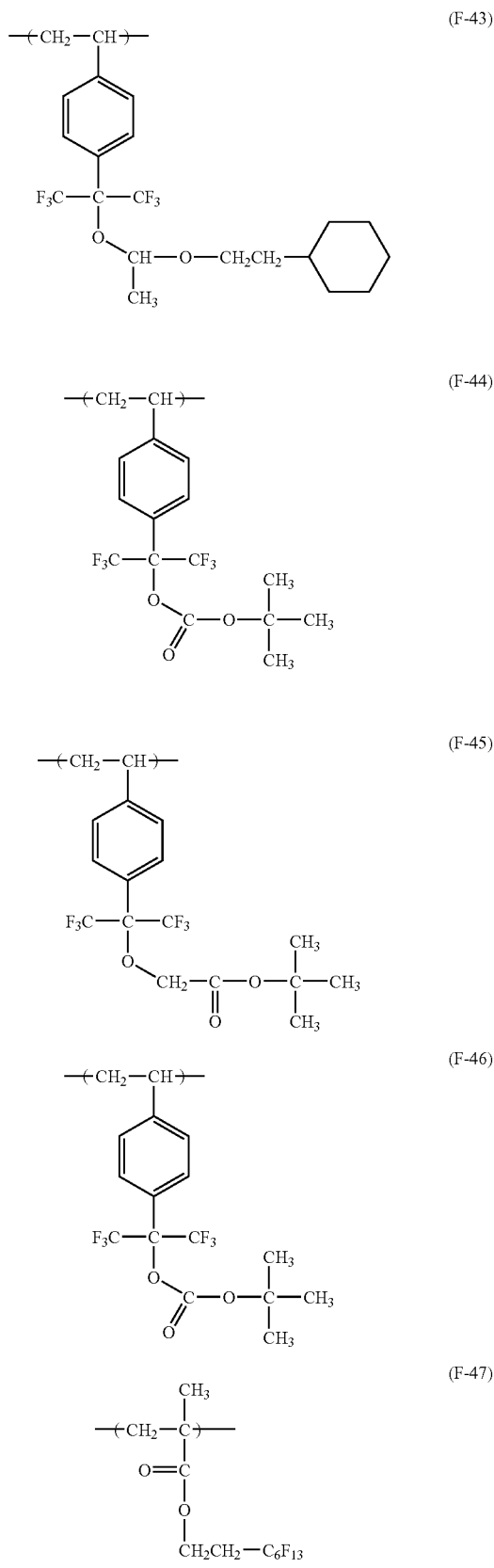

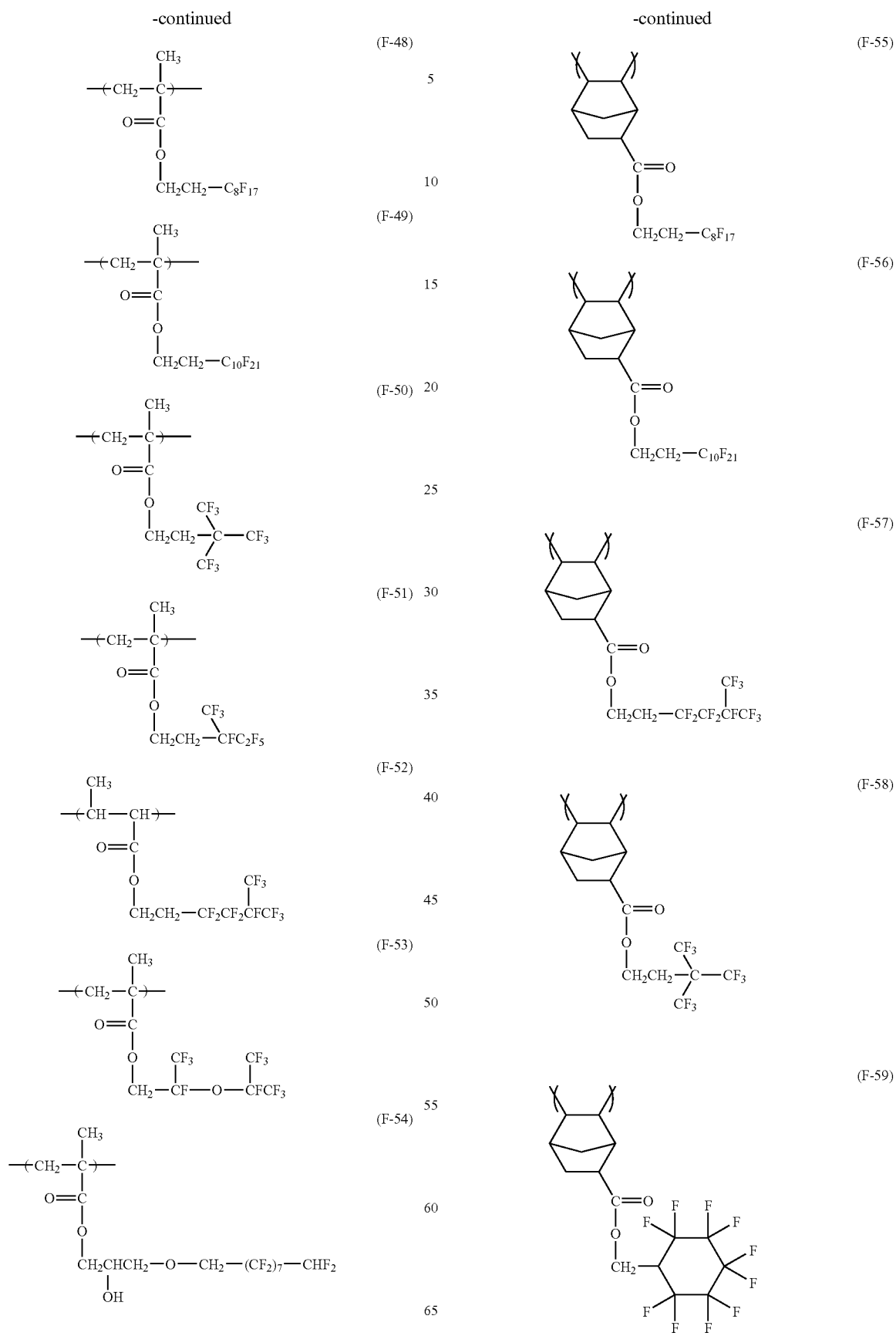

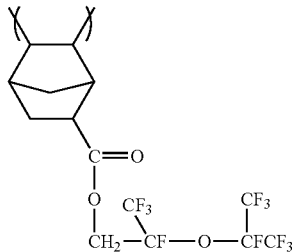
(F-60)

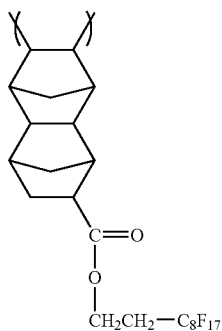
(F-61)

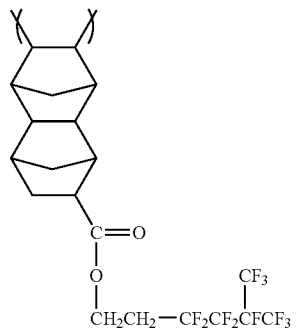
(F-62)

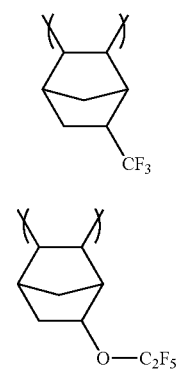

(F-63)

(F-64)

(F-65)

The total content of the repeating units represented by formulae (FA) to (FG) is generally from 10 to 80 mol %, preferably from 30 to 70 mol %, more preferably from 35 to 65 mol %, based on all repeating units constituting the resin.

In the fluorine group-containing resin, in addition to these repeating structural units, other polymerizable monomers may be copolymerized for enhancing the performance of the resist of the present invention.

Examples of the copolymerization monomer which can be used include a compound having one addition-polymerizable unsaturated bond, selected from acrylic acid esters other than those described above, acrylamides, methacrylic acid esters, methacrylamides, allyl compounds, vinyl ethers, vinyl esters, styrenes and crotonic acid esters.

From the standpoint of enhancing the dry etching resistance, controlling the alkali solubility and increasing the adhesion to substrate, the fluorine group-containing resin preferably contains another repeating unit as a copolymerization component in addition to the above-described fluorine atom-containing repeating unit. Preferred examples of the another repeating unit include:

1) a repeating unit having an alicyclic hydrocarbon structure represented by any one of formulae (pI) to (pV) and (II-AB), specifically, repeating units 1 to 23 and repeating units [II-1] to [II-32], preferably repeating units 1 to 23 where Rx is $CF_3$;

2) a repeating unit having a lactone structure represented by any one of formulae (Lc) and (V-1) to (V-5), specifically, repeating units shown above, particularly, repeating units having a group represented by any one of formulae (Lc) and (V-1) to (V-4); and 3) a repeating unit represented by the following formula (XV), (XVI) or (XVII), which is derived from a maleic anhydride, a vinyl ether or a vinyl compound having a cyano group, specifically repeating units (C-1) to (C-15).

In these repeating units, a fluorine atom may or may not be contained.

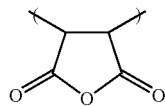
(XV)

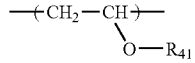
(XVI)

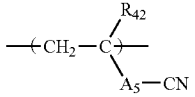
(XVII)

In these formulae, $R_{41}$ represents an alkyl group, a cycloalkyl group, an aralkyl group or an aryl group, and the alkyl group of $R_{41}$ may be substituted by an aryl group.

$R_{42}$ represents a hydrogen atom, a halogen atom, a cyano group or an alkyl group.

$A_5$ represents a single bond, a divalent alkylene, alkenylene, cycloalkylene or arylene group, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represents a single bond or a divalent alkylene, alkenylene, cycloalkylene or arylene group which may have an ether group, an ester group, an amide group, a urethane group or a ureido group.

$R_{24}$ represents a hydrogen atom, an alkyl group, a cycloalkyl group, an aralkyl group or an aryl group.

Examples of each substituent are the same as those described above for the substituents of formulae (FA) to (FG).

Specific examples of the repeating structural units represented by formulae (XV) to (XVII) are set forth below, but the present invention is not limited thereto.

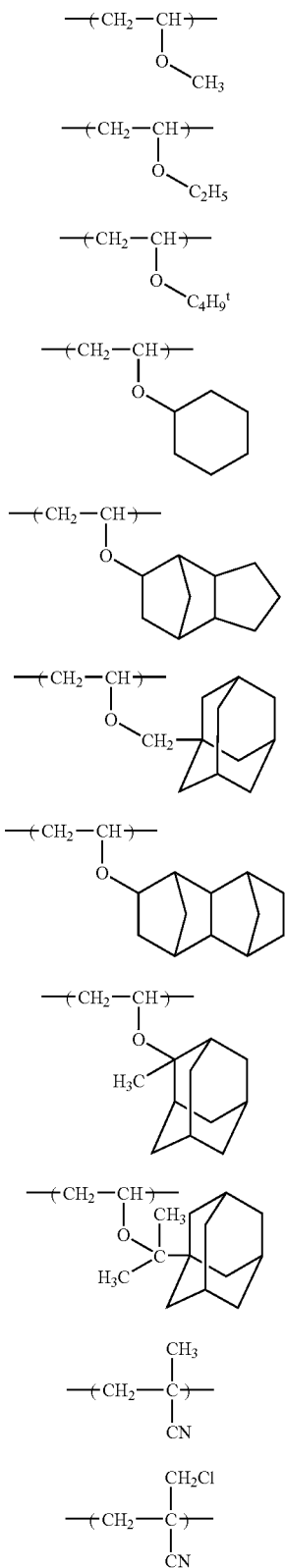

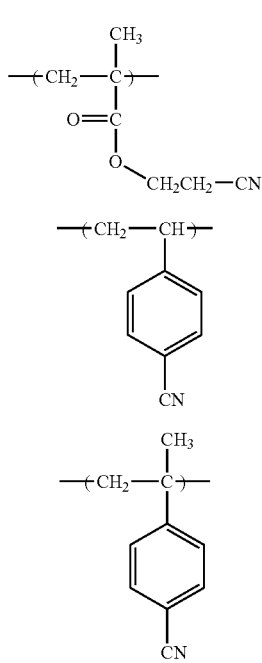

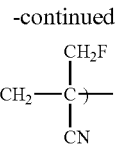

The total amount of the repeating unit represented by any one of formulae (XV) to (XVII) and the another repeating unit is generally from 0 to 70 mol %, preferably from 10 to 60 mol %, more preferably from 20 to 50 mol %, based on all repeating units constituting the resin.

The fluorine group-containing resin may contain an acid-decomposable group in any repeating unit.

The content of the repeating unit having an acid-decomposable group is preferably from 10 to 70 mol %, more preferably from 20 to 60 mol %, still more preferably from 30 to 60 mol %, based on all repeating units.

The fluorine group-containing resin can be synthesized by radical polymerization nearly in the same manner as the alicyclic hydrocarbon-based acid-decomposable resin.

The weight average molecular weight of the resin as the component (B) is preferably from 2,000 to 200,000 in terms of polystyrene by the GPC method. With a weight average molecular weight of 2,000 or more, heat resistance and dry etching resistance can be increased and with a weight average molecular weight of 200,000 or less, developability can be enhanced and at the same time, by virtue of low viscosity, the film-forming property can be improved. The molecular weight is more preferably from 5,000 to 50,000, still more preferably from 7,000 to 30,000. By adjusting the molecular weight, heat resistance, resolving power, development defect and the like of the composition all can be satisfied. The dispersity (Mw/Mn) of the resin as the component (B) is preferably from 1.0 to 3.0, more preferably from 1.2 to 2.5, still more preferably from 1.2 to 1.6. By adjusting the dispersity to an appropriate range, the line edge roughness performance can be enhanced.

In the resist composition of the present invention, the amount of the resin as the component (B) blended in the entire composition is preferably from 40 to 99.99 mass %, more preferably from 50 to 99 mass %, still more preferably from 80 to 96 mass %, based on the entire solid content.

(Basic Compound)

The basic compound includes a nitrogen-containing basic compound such as organic amine, basic ammonium salt and basic sulfonium salt, and the nitrogen-containing basic compound may be sufficient if it does not deteriorate sublimation or resist performance.

Among these nitrogen-containing basic compounds, an organic amine is preferred because of excellent image performance.

Examples of the basic compound which can be used include those described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a "published Japanese translation of a PCT patent application"), and U.S. Pat. Nos. 5,525,453, 5,629,134 and 5,667,938.

Preferred examples of the structure thereof include the structures represented by the following formulae (A) to (E).

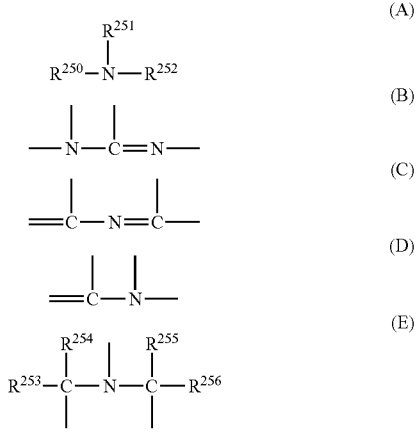

In these formulae, $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups each may contain an oxygen atom, a sulfur atom or a nitrogen atom in the alkyl chain.

$R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is changed to a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds may be used alone, or two or more thereof may be used in combination. The amount of the basic compound used is usually from 0.001 to 10 mass %, preferably from 0.01 to 5 mass %, based on the solid content of the resist composition. The amount used is preferably 0.001 mass % or more for obtaining a sufficiently high addition effect and preferably 10 mass % or less in view of sensitivity and developability of the unexposed area.

(Dissolution Inhibiting Compound Being Capable of Decomposing Under the Action of an Acid to Increase the Solubility in an Alkali Developer and Having a Molecular Weight of 3,000 or Less)

In order to prevent reduction in the transparency to light at 220 nm or less, the dissolution inhibiting compound being capable of decomposing under the action of an acid to increase the solubility in an alkali developer and having a molecular weight of 3,000 or less is preferably an alicyclic or aliphatic compound having an acid-decomposable group, such as acid-decomposable group-containing cholic acid derivatives described in *Proceeding of SPIE*, 2724, 355 (1996). Examples of the acid-decomposable group and the alicyclic structure are the same as those described above for the alicyclic hydrocarbon-based acid-decomposable resin.

In the case where the resist composition of the present invention is exposed to a KrF excimer laser or irradiated with electron beams, the dissolution inhibiting compound preferably contains a structure that the phenolic hydroxyl group of a phenol compound is replaced by an acid-decomposable group. The phenol compound preferably contains from 1 to 9 phenol skeletons, more preferably from 2 to 6 phenol skeletons.

The molecular weight of the dissolution inhibiting compound is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the resist composition.

Specific examples of the dissolution inhibiting compound are set forth below, but the present invention is not limited thereto.

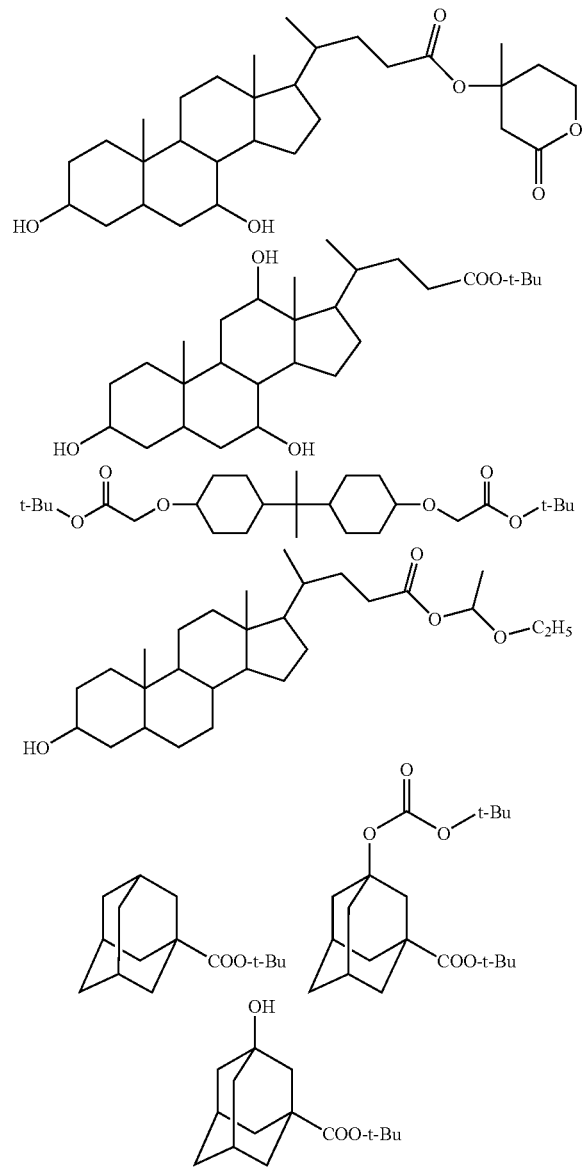

(Resin Soluble in Alkali Developer)

The alkali dissolution rate of the resin soluble in an alkali developer (alkali-soluble resin) is preferably 20 Å/sec or more, more preferably 200 Å/sec or more (Å is angstrom), as measured (at 23° C.) in 0.261 N tetramethylammonium hydroxide (TMAH).

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, O-methylated, O-(1-methoxy)-ethylated, O-(1-ethoxy)ethylated, O-2-tetrahydropyranylated or O-(tert-butoxycarbonyl)methylated at a ratio of 5 to 30 mol %) or O-acylated (for example, o-acylated or O-(tert-butoxy)carbonylated at a ratio of 5 to 30 mol %), a styrene-maleic anhydride copolymer, a styrene-hydroxystyrene copolymer, an o-methylstyrene-hydroxystyrene copolymer, a carboxyl group-containing methacrylic resin including a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer, and an α-methylstyrene-hydroxystyrene copolymer.

The novolak resin can be obtained by subjecting a predetermined monomer as the main component to addition condensation with an aldehyde in the presence of an acidic catalyst.

The weight average molecular weight of the alkali-soluble resin is 2,000 or more, preferably from 5,000 to 200,000, more preferably from 5,000 to 100,000.

The weight average molecular weight used herein is defined as a polystyrene-reduced value measured by gel permeation chromatography.

As for the alkali-soluble resin, two or more kinds of alkali-soluble resins may be used in combination.

The amount of the alkali-soluble resin used is from 40 to 97 mass %, preferably from 60 to 90 mass %, based on the entire solid content of the resist composition.

(Acid Crosslinking Agent Capable of Crosslinking with the Alkali-soluble Resin Under the Action of an Acid)

In the case of a negative resist composition, the resist composition contains a crosslinking agent.

For example, in the case of a negative type such as negative resist used with a KrF excimer laser, a resist pattern is formed by reducing the dissolution rate in the developer, for example, through a crosslinking reaction between a crosslinking agent and a resin triggered by a catalytic reaction of an acid generated in the exposed area. Therefore, a crosslinking agent is sometimes required.

Examples of the crosslinking agent which can be used include amino resins such as glycoluril resin disclosed in JP-A-1-293339 and JP-A-2-15270, glycoluril resin crosslinking agents disclosed in JP-A-5-34922, crosslinking agents comprising an N-(alkoxymethyl)glycoluril compound disclosed in JP-A-6-301200, and N-(alkoxyalkyl)glycoluril and N-(alkoxyalkyl)melamine compounds disclosed in JP-A-2003-302670.

The crosslinking agent may be any compound as long as it can crosslink the resin soluble in an alkali developer under the action of an acid, but the following compounds (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The alkoxymethyl group is preferably an alkoxymethyl group having a carbon number of 6 or less, and the acyloxymethyl group is preferably an acyloxymethyl group having a carbon number of 6 or less.
Among these crosslinking agents, particularly preferred crosslinking agents are set forth below.
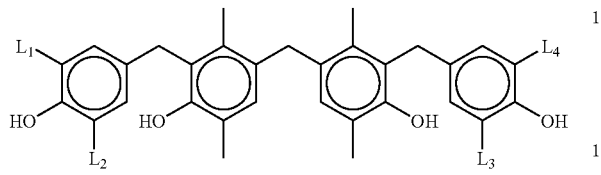
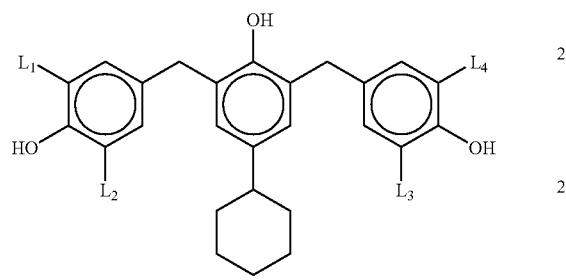
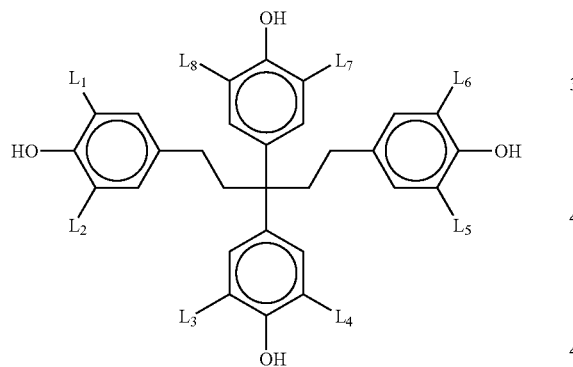
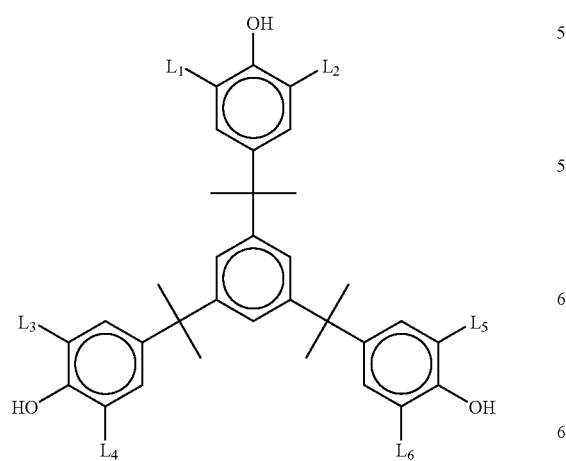
-continued
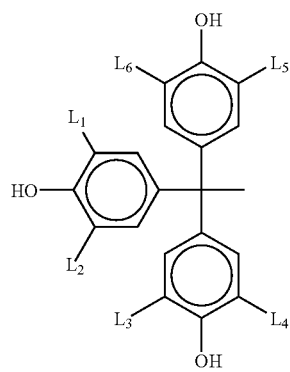
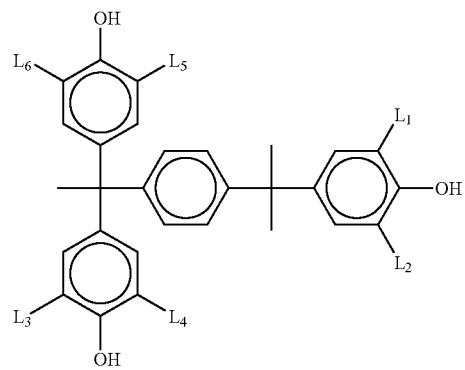
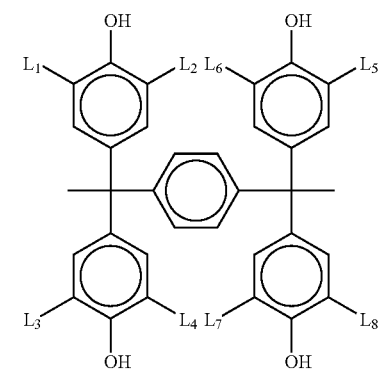
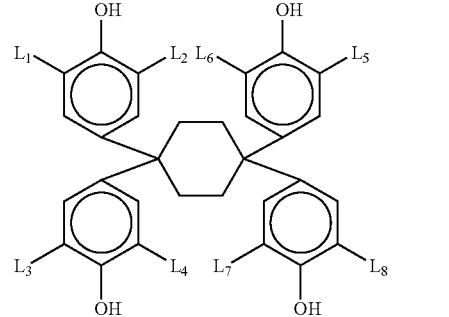
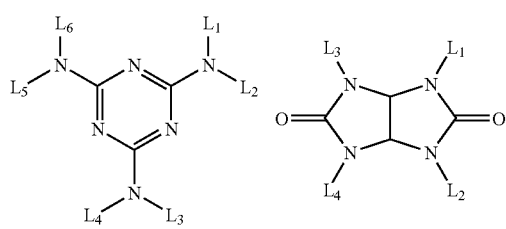

-continued

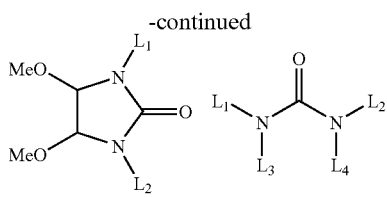

In these formulae, $L^1$ to $L^8$, which may be the same or different, each represents a hydrogen atom, a hydroxymethyl group, a methoxymethyl group, an ethoxymethyl group or an alkyl group having a carbon number of 1 to 6.

The crosslinking agent is usually added in an amount of 3 to 70 mass %, preferably from 5 to 50 mass %, based on the solid content of the resist composition.

(Other Additives)

If desired, the resist composition of the present invention may further contain, for example, a dye, a plasticizer, a photosensitizer, and a compound capable of accelerating the solubility in a developer.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the entire amount of the resin. The amount added is preferably 50 mass % or less from the standpoint of suppressing the development residue or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

(Pattern Forming Method Using the Resist Composition)

The resist composition is coated on a substrate to form a thin film. The thickness of this coated film is preferably from 0.05 to 1.5 μm.

If desired, after a commercially available inorganic or organic antireflection film is provided by coating, the resist film may be provided thereon by coating.

The antireflection film which can be used includes an inorganic film type such as titanium, titanium dioxide, titanium nitride, chromium oxide, carbon, α-silicon and silicon nitride, and an organic film type comprising a light absorbent and a polymer material. The former requires equipment for the film formation, such as vacuum vapor-deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611, a reaction product of a maleic anhydride copolymer and a diamine-type light absorbent described in U.S. Pat. No. 5,294,680, a film comprising a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509. Also, for example, DUV Series and ARC Series produced by Brewer Science, Inc., and AC Series and AR Series produced by Shipley Co., Ltd., may be used as the organic antireflection film.

The resist composition is coated on a substrate (e.g., silicon/silicon dioxide-coated substrate) used in the production of a precision integrated circuit device (if desired, on a substrate having provided thereon the above-described antireflection film), and the resist film formed is exposed through a predetermined mask, baked and developed, whereby a good resist pattern can be obtained. The exposure light used here is preferably light at a wavelength of 150 to 250 nm, and specific examples thereof include KrF excimer laser light (248 nm), ArF excimer laser light (193 nm), $F_2$ excimer laser light (157 nm), X-ray and electron beam.

The alkali developer usable at the development is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine. This alkaline aqueous solution may be used after adding thereto alcohols or a surfactant in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

(Synthesis of Resin (A-1) Used in Positive Resist for Exposure with ArF Excimer Laser)

2-(1-Adamantyl)isopropyl methacrylate, 3-hydroxy-1-adamantyl methacrylate and butyrolactone methacrylate were charged at a ratio of 40/20/40 (by mol) and dissolved in methyl ethyl ketone/tetrahydrofuran (=5/5) to prepare 100 mL of a solution having a solid content concentration of 20 mass %. Subsequently, 2 mol % of polymerization initiator V-65 produced by Wako Pure Chemical Industries, Ltd. was added to this solution, and the resulting solution was added dropwise to 10 mL of methyl ethyl ketone heated at 60° C. over 4 hours in a nitrogen atmosphere. After the completion of dropwise addition, the reaction solution was heated for 4 hours, and 1 mol % of V-65 was again added, followed by stirring for 4 hours. After the completion of reaction, the reaction solution was cooled to room temperature and then crystallized in 3 L of a mixed solvent of distilled water/ISO propyl alcohol (1/1 by mass) to obtain Resin (A-1) which was the precipitated white powder. The polymer compositional ratio determined from $^{13}$CNMR was 41/21/38. The weight average molecular weight of this resin was 10,700.

(Description of Abbreviations)
PGMEA: propylene glycol monomethyl ether acetate
PGME: propylene glycol monomethyl ether
EL: ethyl lactate
BA: butyl acetate
2-BPN: 2-heptanone
CHN: cyclohexanone
MMP: 3-methoxymethyl propionate
GBL: γ-butyrolactone
PC: propylene carbonate
PAG-1 triphenylsulfonium nonaflate
AMINE-1: 2,6-diisopropylaniline
W-1: Troysol S366 (produced by Troy Chemical)

Example 1

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 300 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 2

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 150 nm could be obtained with a rotational speed of 1,400 rpm and baking conditions of 120° C. and 60 seconds. The solution obtained was filtered through a 0.1-μm PE-made filter (47mm UPE Membrane Disks, produced by Mykrolis Corporation) to prepare a positive resist composition.

Example 3

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 100 nm could be obtained with a rotational speed of 1,400 rpm and baking conditions of 120° C. and 60 seconds. The solution obtained was filtered through a 0.1-μm PE-made filter (47mm UPE Membrane Disks, produced by Mykrolis Corporation) to prepare a positive resist composition.

Example 4

Resin (A-1) (12 g), PAG-1 (0.6 g), AMIE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 50 nm could be obtained with a rotational speed of 1,400 rpm and baking conditions of 120° C. and 60 seconds. The solution obtained was filtered through a 0.1-μm PE-made filter (47mm UPE Membrane Disks, produced by Mykrolis Corporation) to prepare a positive resist composition.

Example 5

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 100 nm could be obtained with a rotational speed of 1,000 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 6

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 100 nm could be obtained with a rotational speed of 700 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 7

Resin (A-1) (12 g), PAG-1 (0.6 g), AMINE-1 (0.24 g), W-1 (0.05 g), PGMEA (52.8 g) and EL (35.2 g) were mixed, and the resulting mixed solution was diluted with a mixed solvent at a mass ratio of PGMEA 60% and EL 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 8

Resin (A-1) (12 g), PAG-1 (0.6 g), AMINE-1 (0.24 g), W-1 (0.05 g), PGMEA (52.8 g) and BA (35.2 g) were mixed, and the resulting mixed solution was diluted with a mixed solvent at a mass ratio of PGMEA 60% and BA 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 9

Resin (A-1) (12 g), PAG-1 (0.6 g), AMINE-1 (0.24 g), W-1 (0.05 g), PGMEA (52.8 g) and 2-HPN (35.2 g) were mixed, and the resulting mixed solution was diluted with a mixed solvent at a mass ratio of PGMEA 60% and 2-HPN 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 10

Resin (A-1) (12 g), PAG-1 (0.6 g), AMINE-1 (0.24 g), W-1 (0.05 g), PGMEA (52.8 g) and CHN (35.2 g) were mixed, and the resulting mixed solution was diluted with a mixed solvent at a mass ratio of PGMEA 60% and CHN 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 11

Resin (A-1) (12 g), PAG-1 (0.6 g), AMINE-1 (0.24 g), W-1 (0.05 g), PGMEA (52.8 g) and MMP (35.2 g) were mixed, and the resulting mixed solution was diluted with a mixed solvent at a mass ratio of PGMEA 60% and MMP 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 12

Resin (A-1) (12 g), PAG-1 (0.6 g), AMINE-1 (0.24 g), W-1 (0.05 g), PGMEA (52.8 g) and GBL (35.2 g) were mixed, and the resulting mixed solution was diluted with a mixed solvent at a mass ratio of PGMEA 60% and GBL 40% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 13

Resin (A-1) (12 g), PAG-1 (0.6 g), AMINE-1 (0.24 g), W-1 (0.05 g), PGMEA(87.12 g) and PC (0.88 g) were mixed, and the resulting mixed solution was diluted with a mixed solvent at a mass ratio of PGMEA 99% and PC 1% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Example 14

Resin (A-1) (12 g), PAG-1 (0.6 g), AMINE-1 (0.24 g), W-1 (0.05 g), PGMEA (43.56 g), PGME (43.56 g) and PC (0.88 g) were mixed, and the resulting mixed solution was diluted with a mixed solvent at a mass ratio of PGMEA 49.5%, PGME 49.5% and PC 1% so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 1

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 300 nm could be obtained with a rotational speed of 2,500 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 2

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 150 nm could be obtained with a rotational speed of 2,500 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 3

Resin (A-1) (12 g), PAG-1 (0.6 g), AMINE-1 (0.24 g), W-1 (0.05 g), PGMEA(52.8 g) and PGME (35.2 g) were mixed, and the resulting mixed solution was diluted with a mixed solvent at a mass ratio of PGMEA 60% and PGME 40% so that a film thickness of 100 nm could be obtained with a rotational speed of 2,500 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 4

Resin (A-1) (12 g), PAG-1 (0.6 g), AMINE-1 (0.24 g), W-1 (0.05 g), PGMEA (52.8 g) and PGME (35.2 g) were mixed, and the resulting mixed solution was diluted with a mixed solvent at a mass ratio of PGMEA 60% and PGME 40% so that a film thickness of 50 nm could be obtained with a rotational speed of 2,500 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 5

Resin (A-1) (12 g), PAG-1 (0.6 g), AMINE-1 (0.24 g), W-1 (0.05 g) and PGMEA(88 g) were mixed, and the resulting mixed solution was diluted with PGMEA so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 6

Resin (A-1) (12 g), PAG-1 (0.6 g), AMINE-1 (0.24 g), W-1 (0.05 g) and EL (88 g) were mixed, and the resulting mixed solution was diluted with EL so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 7

Resin (A-1) (12 g), PAG-1 (0.6 g), AMINE-1 (0.24 g), W-1 (0.05 g) and PGME (88 g) were mixed, and the resulting mixed solution was diluted PGME so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

Comparative Example 8

Resin (A-1) (12 g), PAG-1 (0.6 g), AMINE-1 (0.24 g), W-1 (0.05 g) and CHN (88 g) were mixed, and the resulting mixed solution was diluted with CHN so that a film thickness of 150 nm could be obtained with a rotational speed of 1,400 rpm and baking conditions of 120° C. and 60 seconds. The solution obtained was filtered through a 0.1-μm PE-made filter (47 mm UPE Membrane Disks, produced by Mykrolis Corporation) to prepare a positive resist composition.

(Method for Adjusting Solid Content Concentration)

In Examples and Comparative Examples above, as for the diluting amount at the dilution with a solvent, positive resist compositions differing in the solid content were previously prepared, a calibration curve was created by plotting the relationship between the film thickness and the solid content concentration when respective resist compositions were coated at a predetermined rotational speed (for example, 1,400 rpm or 1,000 rpm), the solid content concentration of giving a desired film thickness with a predetermined rotational speed was obtained from the calibration curve created, and the amount of the diluting solvent was determined.

(Method for Coating Resist Composition on Wafer)

On a 8-inch silicon wafer fixed on a wafer chuck of a spin coater, 6 ml of the resist composition was dropped onto the center of the wafer in the stationary state. After the dropping, the wafer was left standing for 5 seconds and then spun at a rotational speed of 500 rpm for 5 seconds to spread the resist composition over the entire wafer surface. Thereafter, the wafer was spun at the rotational speed set in each of Examples and Comparative Examples for 30 seconds to adjust the resist film thickness to the desired thickness and further spun at a rotational speed of 500 rpm for 5 seconds and at a rotational speed of 2,000 rpm for 20 seconds to remove the residual solvent.

(Resist Pattern Formation of Example 1 and Comparative Example 1)

ARC29A produced by Brewer Science Co., Ltd. was uniformly coated on a 8-inch silicon wafer by a spin coater to a thickness of 78 nm and dried under heating at 205° C. for 60 seconds to form an antireflection film. Thereafter, each positive resist composition immediately after the preparation was coated by a spin coater and dried at 120° C. for 60 seconds (PB) to form a resist film of 300 nm.

This resist film was exposed through a 6% halftone mask having a 130 nm line-and-space pattern by using an ArF excimer laser stepper (PAS5500/1100, manufactured by ASML, NA=0.75 (⅔ annular illumination)) and immediately after the exposure, heated on a hot plate at 120° C. for 60 seconds (PEB). Furthermore, the resist film was developed with an aqueous 2.38 mass % ietramethylammonium hydroxide solution at 23° C. for 60 seconds, rinsed with pure water for 30 seconds and then dried to obtain a 130 nm line-and-space resist pattern.

(Resist Pattern Formation of Examples 2 and 7 to 14 and Comparative Examples 2 and 5 to 8)

ARC29A produced by Brewer Science Co., Ltd. was uniformly coated on a 8-inch silicon wafer by a spin coater to a thickness of 78 nm and dried under heating at 205° C. for 60 seconds to form an antireflection film. Thereafter, each positive resist composition immediately after the preparation was coated by a spin coater and dried at 120° C. for 60 seconds (PB) to form a resist film of 150 nm.

This resist film was exposed through a 6% halftone mask having a 90 nm line-and-space pattern by using an ArF excimer laser stepper (PAS5500/1100, manufactured by ASML, NA=0.75 (⅔ annular illumination)) and immediately after the exposure, heated on a hot plate at 120° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 90 nm line-and-space resist pattern.

(Resist Pattern Formation of Examples 3, 5 and 6 and Comparative Example 3)

ARC29A produced by Brewer Science Co., Ltd. was uniformly coated on a 8-inch silicon wafer by a spin coater to a thickness of 78 nm and dried under heating at 205° C. for 60 seconds to form an antireflection film. Thereafter, each positive resist composition immediately after the preparation was coated by a spin coater and dried at 120° C. for 60 seconds (PB) to form a resist film of 100 nm.

This resist film was exposed through a 6% halftone mask having a 90 nm line-and-space pattern by using an ArF excimer laser stepper (PAS5500/1100, manufactured by ASML, NA=0.75 (⅔ annular illumination)) and immediately after the exposure, heated on a hot plate at 120° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 90 nm line-and-space resist pattern.

(Resist Pattern Formation of Example 4 and Comparative Example 4)

ARC29A produced by Brewer Science Co., Ltd. was uniformly coated on a 8-inch silicon wafer by a spin coater to a thickness of 78 nm and dried under heating at 205° C. for 60 seconds to form an antireflection film. Thereafter, each positive resist composition immediately after the preparation was coated by a spin coater and dried at 120° C. for 60 seconds (PB) to form a resist film of 50 nm.

This resist film was exposed through a 6% halftone mask having a 90 nm line-and-space pattern by using an ArF excimer laser stepper (PAS5500/1100, manufactured by ASML, NA=0.75 (⅔ annular illumination)) and immediately after the exposure, heated on a hot plate at 120° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 90 nm line-and-space resist pattern.

(Film Thickness Uniformity)

Each positive resist composition was coated on a silicon wafer by a spin coater and dried at 120° C. for 60 seconds (PB) to form a resist film having the film thickness used for the resist pattern formation in Examples and Comparative Examples.

The film thickness of the resist film was measured at 49 portions in the wafer plane by a film thickness inspecting apparatus (manufactured by Dainippon Screen Mfg. Co., Ltd.), and 3σ of the standard deviation determined is shown in Table 1 as the index for the film thickness uniformity.

(Pattern Dimension Uniformity)

With respect to the resist pattern formed over the entire wafer surface, the length was measured at 500 portions in the wafer plane by using a length measurement scanning electron microscope (SEM), and 3σ of the standard deviation determined is shown in Table 1 as the index for the dimensional uniformity. As the 3σ is smaller, the pattern dimension is uniform with less variation.

TABLE 1

|  | Conditions | | | Results | |
| --- | --- | --- | --- | --- | --- |
|  |  |  |  |  | Pattern |
|  | Solvent | Rotational Speed (rpm) | Thickness (nm) | Film Thickness Uniformity (nm) | Dimension Uniformity (nm) |
| Example 1 | PGMEA + PGME | 1400 | 300 | 2.3 | 4.5 |
| Example 2 | PGMEA + PGME | 1400 | 150 | 1.4 | 3.5 |
| Example 3 | PGMEA + PGME | 1400 | 100 | 1.2 | 3.6 |
| Example 4 | PGMEA + PGME | 1400 | 50 | 0.8 | 3.8 |
| Example 5 | PGMEA + PGME | 1000 | 100 | 1.4 | 3.4 |
| Example 6 | PGMEA + PGME | 700 | 100 | 1.6 | 3.5 |
| Example 7 | PGMEA + EL | 1400 | 150 | 1.3 | 3.2 |
| Example 8 | PGMEA + BA | 1400 | 150 | 1.3 | 3.6 |
| Example 9 | PGMEA + 2-HPN | 1400 | 150 | 1.4 | 3.5 |
| Example 10 | PGMEA + CHN | 1400 | 150 | 1.5 | 3.2 |
| Example 11 | PGMEA + MMP | 1400 | 150 | 1.5 | 3.5 |
| Example 12 | PGMEA + GBL | 1400 | 150 | 1.3 | 3.5 |
| Example 13 | PGMEA + PC | 1400 | 150 | 1.5 | 3.6 |
| Example 14 | PGMEA + PGME | 1400 | 150 | 1.3 | 3.4 |
| Comparative Example 1 | PGMEA + PGME | 2500 | 300 | 2.3 | 5.6 |
| Comparative Example 2 | PGMEA + PGME | 2500 | 150 | 1.4 | 4.2 |
| Comparative Example 3 | PGMEA + PGME | 2500 | 100 | 1.1 | 4.7 |
| Comparative Example 4 | PGMEA + PGME | 2500 | 50 | 0.7 | 5.5 |
| Comparative Example 5 | PGMEA | 1400 | 150 | 1.3 | 4.4 |
| Comparative Example 6 | EL | 1400 | 150 | 1.4 | 4.8 |
| Comparative Example 7 | PGME | 1400 | 150 | 1.3 | 4.6 |
| Comparative Example 8 | CHN | 1400 | 150 | 1.4 | 4.9 |

The film thickness uniformity in Examples is equal to the film thickness uniformity in Comparative Examples, but the pattern dimension uniformity in Examples is smaller by 0.7 nm or more than the pattern dimension uniformity in Comparative Examples and the effect of enhancing the dimensional uniformity is confirmed. This reveals that when the resist composition and the pattern forming method of the present invention are used, a resist film having a uniform film thickness and a uniform film quality can be obtained.

The present application claims foreign priority based on Japanese Patent Application (JP 2005-289040) filed Sep. 30, 2005, the contents of which is incorporated herein by reference.

What is claimed is:

1. A pattern forming method comprising:

coating a resist composition having a solids content concentration of 1.0 to 10.0 mass % on a substrate;

adjusting a rotational speed of the substrate within a range of 500 to 1,500 rpm so that a film thickness of the resist composition coated is adjusted to be 50 to 200 nm; and subjecting the resist composition to drying, exposure and development, wherein the resist composition comprises:

(A) a compound capable of generating an acid upon irradiation with one of actinic rays and radiation;

(B) a resin of which dissolution rate in an alkali developer increases under the action of an acid;

(C) a mixed solvent; and (D) a surfactant, and the mixed solvent (C) comprises at least one member selected from a group A of solvents and at least one member selected from a group B of solvents, or comprises at least one member selected from the group A of solvents and at least one member selected from a group C of solvents:

Group A: propylene glycol monoalkyl ether carboxylates,

Group B: propylene glycol monoalkyl ethers, alkyl lactates, acetic acid esters, one of chain and cyclic ketones, and alkoxyalkyl propionates, and Group C: γ-butyrolactone, ethylene carbonate and propylene carbonate.

2. The pattern forming method as claimed in claim 1, wherein the surfactant (D) is one of a silicon- and fluorine-containing nonionic surfactant.

3. The pattern forming method as claimed in claim 1, wherein the resin (B) comprises at least one repeating unit selected from repeating units having an alicyclic hydrocarbon-containing structure represented by one of formulae (pI) to (pV) and a repeating unit represented by formula (II-AB):

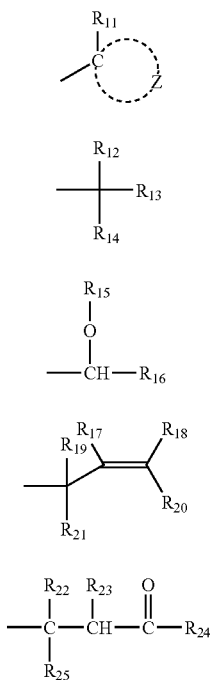

(pI)

(pII)

(pIII)

(pIV)

(pV)

wherein

R$_{11}$ represents one of a methyl group, an ethyl group, an n-propyl group, an isopropyl group, an n-butyl group, an isobutyl group and a sec-butyl group, Z represents an atomic group forming an alicyclic hydrocarbon group together with the carbon atom, R$_{12}$ to R$_{16}$ each independently represents one of a linear alkyl group having a carbon number of 1 to 4, a branched alkyl group having a carbon number of 1 to 4, and an alicyclic hydrocarbon group, at least one of R$_{12}$ to R$_{14}$ represents an alicyclic hydrocarbon group, and one of R$_{15}$ and R$_{16}$ represents an alicyclic hydrocarbon group, R$_{17}$ to R$_{21}$ each independently represents one of a hydrogen atom, one of a linear and a branched alkyl group having a carbon number of 1 to 4, and an alicyclic hydrocarbon group, at least one of R$_{17}$ to R$_{21}$ represents an alicyclic hydrocarbon group, and one of R$_{19}$ and R$_{21}$ represents one of a linear alkyl group having a carbon number of 1 to 4, a branched alkyl group having a carbon number of 1 to 4, and an alicyclic hydrocarbon group, R$_{22}$ to R$_{25}$ each independently represents one of a linear alkyl group having a carbon number of 1 to 4, a branched alkyl group having a carbon number of 1 to 4, and an alicyclic hydrocarbon group, and at least one of R$_{22}$ to R$_{25}$ represents an alicyclic hydrocarbon group, and R$_{23}$ and R$_{24}$ may combine with each other to form a ring;

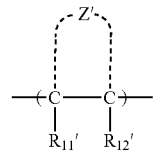

(II-AB)

wherein

R$_{11'}$ and R$_{12'}$ each independently represents one of a hydrogen atom, a cyano group, a halogen atom, and an alkyl group which may have a substituent, and Z' represents an atomic group forming an alicyclic structure containing two bonded carbon atoms, which may have a substituent.

4. A resist composition used for a pattern forming method claimed in the claim 1.

5. The pattern forming method as claimed in claim 1, wherein the propylene glycol monoalkyl ether carboxylates as Group A consist of propylene glycol monomethyl ether acetate, propylene glycol monomethyl ether propionate, propylene glycol monoethyl ether acetate and propylene glycol monoethyl ether propionate.

6. The pattern forming method as claimed in claim 5, wherein the mixed solvent (C) comprises at least one member selected from the Group A of solvents and at least one member selected from the Group B of solvents, and wherein in Group B, the propylene glycol monoalkyl ethers consist of propylene glycol monomethyl ether and propylene glycol monoethyl ether, the alkyl lactates consist of methyl lactate and ethyl lactate, the acetic acid esters consist of butyl acetate, pentyl acetate and hexyl acetate, the chain ketones consist of heptanones, the cyclic ketones consist of cyclopentanone, cyclohexanone and cycloheptanone, and the alkoxyalkyl propionates consist of 3-ethoxyethyl propionate, 3-methoxymethyl propionate, 3-methyoxyethyl propionate and 3-ethoxymethyl propionate.

7. The pattern forming method as claimed in claim 5, wherein the mixed solvent (C) comprises at least one member selected from the Group A of solvents and at least one member selected from the Group C of solvents.

8. The pattern forming method as claimed in claim 6, wherein the weight ratio (A:B) of the Group A solvent and the Group B solvent is from 90:10 to 15:85.

9. The pattern farming method as claimed in claim 7, wherein the weight ratio (A:C) of the Group A solvent and the Group C solvent is from 99.9:0.1 to 75:25.

10. The pattern forming method as claimed in claim 1, wherein the resin (B) comprises a hydroxystyrene repeating unit.

11. The pattern forming method as claimed in claim 1, wherein the resin (B) comprises a repeating unit having a lactone group.

12. The pattern forming method as claimed is claim 11, wherein the repeating unit having a lactone group is a repeating unit represented by formula (AI):

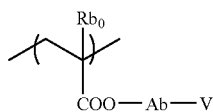

(AI)

wherein $Rb_0$ represents a hydrogen atom, a halogen atom or an alkyl group having a carbon number of 1 to 4;

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof; and V represents a group represented by any one of formulae (LC1-1) to (LC1-16):

LC1-1

LC1-2

LC1-3

LC1-4

LC1-5

LC1-6

-continued

LC1-7

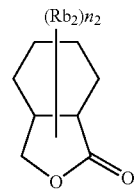

LC1-8

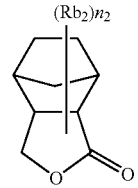

LC1-9

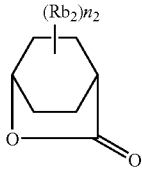

LC1-10

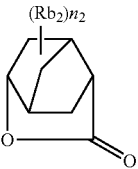

LC1-11

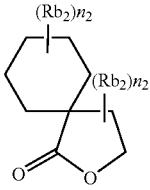

LC1-12

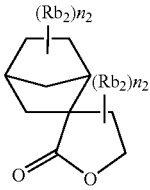

LC1-13

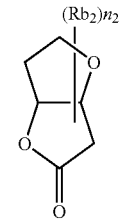

-continued
LC1-14
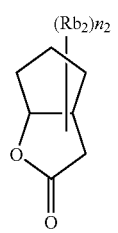
LC1-15
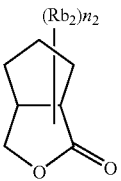
-continued
LC1-16
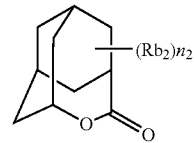
wherein $Rb_2$ represents a substituent; and
$n_2$ represents an integer of 0 to 4, provided that when $n_2$ is an integer of 2 or more, the plurality of $Rb_2$'s are the same or different, and the plurality of $Rb_2$'s may combine with each other to form a ring.
* * * * *